(12) United States Patent
Ninomiya et al.

(10) Patent No.: US 9,087,582 B2
(45) Date of Patent: Jul. 21, 2015

(54) DRIVING METHOD OF NON-VOLATILE MEMORY ELEMENT AND NON-VOLATILE MEMORY DEVICE

(71) Applicant: PANASONIC CORPORATION, Osaka (JP)

(72) Inventors: Takeki Ninomiya, Osaka (JP); Koji Katayama, Nara (JP); Takeshi Takagi, Kyoto (JP); Zhiqiang Wei, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/265,222

(22) Filed: Apr. 29, 2014

(65) Prior Publication Data

US 2014/0321197 A1  Oct. 30, 2014

(30) Foreign Application Priority Data

Apr. 30, 2013  (JP) ................................. 2013-095116

(51) Int. Cl.
  *G11C 13/00*  (2006.01)

(52) U.S. Cl.
  CPC ........ *G11C 13/0069* (2013.01); *G11C 13/0007* (2013.01); *G11C 2013/0071* (2013.01); *G11C 2013/0073* (2013.01); *G11C 2213/79* (2013.01)

(58) Field of Classification Search
  CPC .................................................. G11C 13/0069
  USPC .......................................................... 365/148
  See application file for complete search history.

(56) References Cited

U.S. PATENT DOCUMENTS

| 7,384,792 | B1 | 6/2008 | Wang et al. |
| 7,511,986 | B2 * | 3/2009 | Horii et al. ..................... 365/148 |
| 8,144,499 | B2 * | 3/2012 | Kitagawa et al. ............. 365/148 |
| 2004/0245557 | A1 | 12/2004 | Seo et al. |
| 2004/0264244 | A1 | 12/2004 | Morimoto |

(Continued)

FOREIGN PATENT DOCUMENTS

| JP | 2009-146478 A | 7/2009 |
| JP | 2012-079372 A | 4/2012 |

(Continued)

OTHER PUBLICATIONS

Zhuang et al., "Novell Colossal Magnetoresistive Thin Film Non-volatile Resistance Random Access Memory (RAAM)," IEDM Technical Digest, Dec. 2002, pp. 193-196.

*Primary Examiner* — Son Mai
(74) *Attorney, Agent, or Firm* — McDermott Will & Emery LLP

(57) ABSTRACT

In a driving method of a non-volatile memory element, the polarity of a write voltage pulse applied to change a variable resistance layer from a high-resistance state to a low-resistance state is such that an input/output terminal which is more distant from the variable resistance element becomes a source terminal, and when a first write voltage pulse is applied to change the variable resistance layer in the high-resistance state to the low-resistance state, a first gate voltage is applied to a gate terminal, while when a second write voltage pulse which is greater in absolute value of voltage than the first write voltage pulse is applied to change the variable resistance layer in an excess-resistance state to the low-resistance state, a second gate voltage which is smaller in absolute value than the first gate voltage is applied to the gate terminal.

21 Claims, 12 Drawing Sheets

(56) References Cited

U.S. PATENT DOCUMENTS

| | | |
|---|---|---|
| 2005/0206892 A1 | 9/2005 | Wang et al. |
| 2007/0114587 A1 | 5/2007 | Seo et al. |
| 2007/0140900 A1 | 6/2007 | Wang et al. |
| 2007/0153267 A1 | 7/2007 | Wang et al. |
| 2007/0153269 A1 | 7/2007 | Wang et al. |
| 2007/0229817 A1 | 10/2007 | Wang et al. |
| 2008/0309918 A1 | 12/2008 | Guo et al. |
| 2009/0034320 A1 | 2/2009 | Ueda |
| 2009/0046284 A1 | 2/2009 | Wang et al. |
| 2009/0066946 A1 | 3/2009 | Wang et al. |
| 2009/0086202 A1 | 4/2009 | Wang et al. |
| 2009/0161408 A1* | 6/2009 | Tanigami et al. ............. 365/148 |
| 2010/0070197 A1 | 3/2010 | Wang et al. |
| 2010/0085564 A1 | 4/2010 | Guo et al. |
| 2010/0110424 A1 | 5/2010 | Wang et al. |
| 2010/0114514 A1 | 5/2010 | Wang et al. |
| 2010/0296086 A1 | 11/2010 | Wang et al. |
| 2011/0122714 A1 | 5/2011 | Chen et al. |
| 2011/0128776 A1 | 6/2011 | Katoh et al. |
| 2011/0140209 A1 | 6/2011 | Wang et al. |
| 2011/0149635 A1 | 6/2011 | Shiimoto et al. |
| 2011/0212512 A1 | 9/2011 | Wang et al. |
| 2012/0086021 A1 | 4/2012 | Wang |
| 2012/0292589 A1 | 11/2012 | Yoneda et al. |
| 2012/0327408 A1 | 12/2012 | Guo et al. |
| 2013/0010522 A1 | 1/2013 | Kanzawa et al. |
| 2013/0148408 A1 | 6/2013 | Kawai et al. |
| 2013/0188414 A1 | 7/2013 | Kawai et al. |
| 2013/0208531 A1 | 8/2013 | Katoh et al. |
| 2014/0043607 A1 | 2/2014 | Wang et al. |
| 2014/0050015 A1* | 2/2014 | Katoh ........................... 365/148 |

FOREIGN PATENT DOCUMENTS

| | | |
|---|---|---|
| WO | 2010/131477 A1 | 11/2010 |
| WO | 2012/056689 A1 | 5/2012 |
| WO | 2012/132341 A1 | 10/2012 |

* cited by examiner

Access M11
Write LR state after excess-resistance state

DRIVING METHOD OF NON-VOLATILE MEMORY ELEMENT AND NON-VOLATILE MEMORY DEVICE

CROSS-REFERENCE TO RELATED PATENT APPLICATION

The application claims priority to Japanese Patent Application No. 2013-095116 filed on Apr. 30, 2013, the entire disclosure of which is incorporated herein by reference.

BACKGROUND OF THE DISCLOSURE

1. Field of the Disclosure

The present disclosure relates to a driving method of a non-volatile memory element and a non-volatile memory device.

2. Description of the Related Art

In recent years, with progresses of digital technologies, electronic devices such as portable information devices and information home electric appliances have been developed to provide higher functionalities. With achievement of the higher functionalities of these electronic devices, semiconductor elements incorporated into the electronic devices have been developed to achieve further miniaturization and higher speeds. Among them, the use of a high-capacity non-volatile memory device, which is represented by a flash memory, has been expanding at a high pace. Moreover, as a non-volatile memory device in next generation which may replace the flash memory, a non-volatile memory device including a variable resistance non-volatile memory element having a characteristic in which its resistance value changes reversibly in response to an electric signal, has been studied and developed.

Japanese Laid-Open Patent Application Publication No. 2004-363604 discloses a non-volatile memory device which is of 1T-1R or 1D-1R type and includes a transistor formed on a substrate and a data storage section connected to a drain of the transistor, and comprises a data storage material layer in which a resistive characteristic of the data storage section which occurs in a predetermined voltage range is completely different from a resistive characteristic thereof which occurs in another voltage range. This publication also discloses as examples of a variable resistance material layer which may be used as the data storage material layer, a transition metal oxide layer such as a nickel oxide layer (NiO), a vanadium oxide layer ($V_2O_5$), a zinc oxide layer (ZnO), a niobium oxide layer ($Nb_2O_5$), a titanium oxide layer ($TiO_2$), a tungsten oxide layer ($WO_3$), or a cobalt oxide layer (CoO).

According to W. W. Zhuang et al., "Novell Colossal Magnetoresistive Thin Film Nonvolatile Resistance Random Access Memory (RRAM)", IEDM Technical Digest, pp. 193-196, December 2002, PCMO ($Pr_{(1-x)}Ca_xMnO_3$) is used as the variable resistance material layer.

SUMMARY OF THE INVENTION

An object of one non-limiting and exemplary embodiment is to lessen non-uniformity of resistance values in a non-volatile memory element.

In one general aspect, the technique disclosed here is a method of driving a non-volatile memory element including: a variable resistance element including a first electrode, a second electrode, and a variable resistance layer which is disposed between the first electrode and the second electrode and reversibly changes its resistance state between a low-resistance state and a high-resistance state in which a resistance value is greater than a resistance value corresponding to the low-resistance state, in response to a voltage pulse applied between the first electrode and the second electrode; and a field effect transistor including a first input/output terminal connected to the first electrode, a second input/output terminal, and a gate terminal for controlling electric conduction between the first input/output terminal and the second input/output terminal; the method comprising: applying an erase voltage pulse with a first polarity between the second electrode and the second input/output terminal, to change the variable resistance layer from the low-resistance state to the high-resistance state; applying a write voltage pulse with a second polarity which is different from the first polarity, between the second electrode and the second input/output terminal, to change the variable resistance layer from the high-resistance state to the low-resistance state; wherein the second polarity is such that the second input/output terminal of the field effect transistor becomes a source terminal; applying a first gate voltage to the gate terminal of the field effect transistor, when a first write voltage pulse is applied between the second electrode and the second input/output terminal, to change the variable resistance layer in the high-resistance state to the low-resistance state; and applying a second gate voltage which is smaller in absolute value than the first gate voltage, to the gate terminal of the field effect transistor, when a second write voltage pulse which is greater in absolute value of voltage than the first write voltage pulse is applied between the second electrode and the second input/output terminal, to change the variable resistance layer in an excess-resistance state to the low-resistance state.

According to one aspect of the present disclosure, it becomes possible to lessen the non-uniformity of the resistance values in a non-volatile memory element.

The benefits and/or advantages may be individually provided by the various embodiments and features of the specification and drawings disclosure, and need not all be provided in order to obtain one or more of the same.

DETAILED DESCRIPTION OF THE DISCLOSURE

Figure 1:
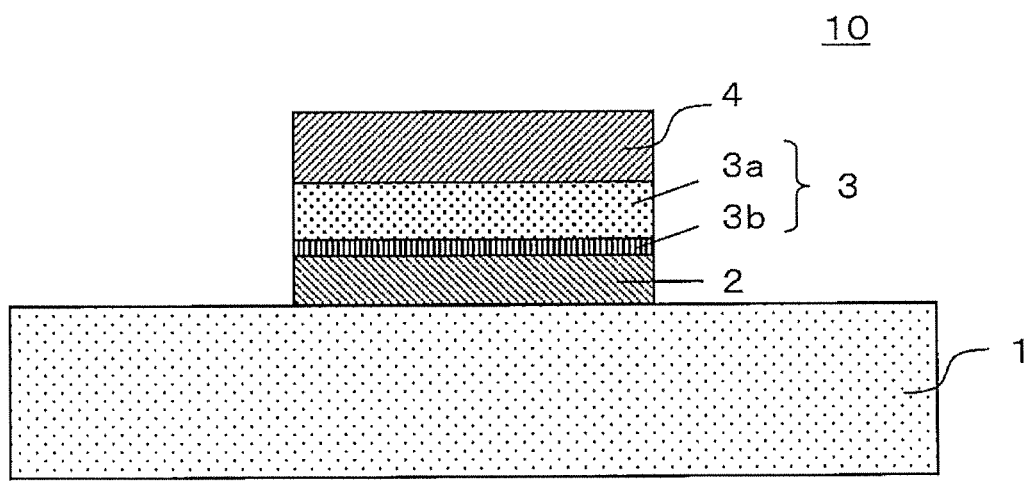
FIG. 1 is a cross-sectional view showing an exemplary schematic configuration of a variable resistance element included in a non-volatile memory element according to Embodiment 1.

To lessen the non-uniformity of the resistance values in the variable resistance non-volatile memory element, intensive study was conducted, and as a result the following was found out.

In the case of the variable resistance non-volatile memory element, there may exist a problem associated with a rewrite characteristic. This will be described specifically. The resistance value corresponding to a high-resistance-value state (high-resistance state) resulting from a change from a low-resistance-value state (low-resistance state), is not always constant, but may be sometimes greater than the resistance value corresponding to a normal high-resistance state. If a normal write voltage pulse is applied to the non-volatile memory element under such an excess-resistance state, the low-resistance state cannot be written in the non-volatile memory element. To allow the low-resistance state to be written in the non-volatile memory element in such a case, it is necessary to apply to the element a pulse having a higher voltage than the normal write voltage pulse.

However, in a case where writing is performed using the pulse having a higher voltage than the normal write voltage pulse, a current with a great magnitude flows through the non-volatile memory element, so that the characteristic of the non-volatile memory element degrades and the non-uniformity of the resistance values occurs. Once the non-uniformity of the resistance values occurs, the non-uniformity will not be resolved. It is estimated that the non-uniformity of the resistance values is due to irreversible expansion of a filament which would be caused by the fact that the current with a great magnitude flows through the non-volatile memory element.

In a case where the non-volatile memory element under the excess-resistance state is changed to the low-resistance state, the non-uniformity of the resistance values would be effectively lessened by setting a compliance in a current (steering a current) flowing through the non-volatile memory element. In setting of the current compliance, a gate voltage of a field effect transistor included in the non-volatile memory element may be utilized.

To accurately set the current compliance using the gate voltage, it is necessary to mitigate an influence of a body effect. To attain this, one of two main electrodes of the field effect transistor which is not connected to the variable resistance element preferably becomes a source electrode, in a case where the write voltage pulse is applied to change the element to the low-resistance state. This is because if the main electrode connected to the variable resistance element becomes the source electrode, the electric potential of the source electrode may be varied under an influence of an electric potential decrease in the variable resistance element.

As used herein, the gate voltage refers to the electric potential of a gate terminal on the basis of a substrate electric potential, i.e., an electric potential difference between the substrate and the gate terminal.

To achieve the above described relation, a memory cell is fabricated by connecting the variable resistance element and the field effect transistor to each other while considering the polarity of the variable resistance element (direction of a current flowing when the element is changed to the low-resistance state) and the polarity (N-type or P-type) of the field effect transistor. Specifically, the variable resistance element and the field effect transistor are connected to each other so that the main electrode which is more distant from the variable resistance element becomes the source electrode, when the element is changed to the low-resistance state.

Under the above configuration, if it is determined that the non-volatile memory element is in the excess-resistance state, the gate voltage of the field effect transistor is set lower than that in a normal state, in a case where the low-resistance state is written in the non-volatile memory element. Such control makes it possible to implement appropriate current compliance (steering) using the field effect transistor. As a result, it becomes possible to lessen the non-uniformity of the resistance values which would be caused by the fact that the current with an excessive magnitude flows through the non-volatile memory element when the element is changed to the low-resistance state.

Hereinafter, embodiments of the present disclosure will be described with reference to the attached drawings.

The embodiments described hereinafter are specific examples of the present disclosure. Numeric values, shapes, materials, constituents (elements), layout positions of the constituents, connection form of the constituents, steps, the order of the steps, etc., which are illustrated in the embodiments described below, are merely exemplary, and are not intended to limit the present disclosure. Also, among the constituents in the embodiments described below, the constituents which are not recited in independent claims defining a broadest concept of the present disclosure will be described as arbitrary constituents constituting an exemplary embodiment. Description of the constituents designated by the same reference symbols in the drawings will be sometimes omitted. For easier understanding, in the drawings, the constituents are schematically shown, and their shapes, dimension ratio, etc., are not sometimes accurate. Moreover, in a manufacturing method, the order of the steps, etc., can be changed and other known steps may be added as necessary.

Embodiment 1

According to Embodiment 1, there is provided a method of driving a non-volatile memory element including: a variable resistance element including a first electrode, a second electrode, and a variable resistance layer which is disposed between the first electrode and the second electrode and reversibly changes its resistance state between a low-resistance state and a high-resistance state in which a resistance value is greater than a resistance value corresponding to the low-resistance state, in response to a voltage pulse applied between the first electrode and the second electrode; and a field effect transistor including a first input/output terminal connected to the first electrode, a second input/output terminal, and a gate terminal for controlling electric conduction between the first input/output terminal and the second input/output terminal; the method comprising: applying an erase voltage pulse with a first polarity between the second electrode and the second input/output terminal, to change the variable resistance layer from the low-resistance state to the high-resistance state; applying a write voltage pulse with a second polarity which is different from the first polarity, between the second electrode and the second input/output terminal, to change the variable resistance layer from the high-resistance state to the low-resistance state; wherein the second polarity is such that the second input/output terminal of the field effect transistor becomes a source terminal; applying a first gate voltage to the gate terminal of the field effect transistor, when a first write voltage pulse is applied between the second electrode and the second input/output terminal, to change the variable resistance layer in the high-resistance state to the low-resistance state; and applying a second gate voltage which is smaller in absolute value than the first gate voltage, to the gate terminal of the field effect transistor, when a second write voltage pulse which is greater in absolute value of voltage than the first write voltage pulse is applied between the second electrode and the second input/output terminal, to change the variable resistance layer in an excess-resistance state to the low-resistance state.

In accordance with this method, it becomes possible to lessen non-uniformity of resistance values in the non-volatile memory element.

Each of the "first gate voltage" and the "second gate voltage" refers to the electric potential of the gate terminal on the basis of a substrate electric potential, i.e., an electric potential difference between the substrate and the gate terminal.

The "excess-resistance state" is defined as a state in which the resistance value of the non-volatile memory element in the excess-resistance state has increased to a level at which it is necessary to apply a voltage which is greater in absolute value than a voltage applied to change the non-volatile memory element in the high-resistance state to the low-resistance state, in order to change the non-volatile memory element in the excess-resistance state to the low-resistance state.

The "excess-resistance state" does not include a state in which the non-volatile memory element just after manufacturing does not initiate a resistance changing operation unless forming is performed. The "excess-resistance state" includes a state in which a voltage pulse is not applied even once to the non-volatile memory element which does not require the forming, after the non-volatile memory element is manufactured.

A determination criterion used to determine whether or not the non-volatile memory element is in the excess-resistance state is not particularly limited.

Specifically, for example, it may be determined that the non-volatile memory element is in the excess-resistance state in a case where the resistance value of the non-volatile memory element falls in a range which is higher than a high-resistance range, when the high-resistance range is defined as a range of the resistance value of the non-volatile memory element, which is now in the high-resistance state and will be changed to the low-resistance state by applying a first write voltage pulse, may take. In this case, when an excess-resistance range is defined as a range of the resistance value which the non-volatile memory element in the excess-resistance state may take, the resistance value as a lower limit in the excess-resistance range may be greater than the resistance value as an upper limit in the high-resistance range.

Or, for example, it may be determined that the non-volatile memory element is in the excess-resistance state in a case where the non-volatile memory element is not changed to the low-resistance state even when the first write voltage pulse is applied to the non-volatile memory element in the high-resistance state.

In the above driving method, the field effect transistor may be a N-type FET; the first polarity may be such that an electric potential of the second input/output terminal becomes lower than an electric potential of the second electrode; and the second polarity may be such that the electric potential of the second input/output terminal becomes higher than the electric potential of the second electrode.

In the above driving method, the field effect transistor may be a P-type FET; the first polarity may be such that an electric potential of the second input/output terminal becomes higher than an electric potential of the second electrode; and the second polarity may be such that the electric potential of the second input/output terminal becomes lower than the electric potential of the second electrode.

In the above driving method, the variable resistance layer may include a first variable resistance layer comprising an oxygen-deficient metal oxide; and a second variable resistance layer comprising a metal oxide which is lower in degree of oxygen deficiency than the first variable resistance layer; the field effect transistor may be a N-type FET; and the first variable resistance layer may be in contact with the second electrode, and the second variable resistance layer may be in contact with the first electrode.

In this method, it becomes possible to attain the non-volatile memory element having a good rewrite characteristic, and integrate the non-volatile memory elements with a higher density by using the N-type MISFETs.

In the above driving method, the variable resistance layer may include a first variable resistance layer comprising an oxygen-deficient metal oxide; and a second variable resistance layer comprising a metal oxide which is lower in degree of oxygen deficiency than the first variable resistance layer; and the field effect transistor may be a P-type FET; and the first variable resistance layer may be in contact with the first electrode, and the second variable resistance layer may be in contact with the second electrode.

In this method, it becomes possible to attain the non-volatile memory element including the variable resistance element which is easily processed.

In the above driving method, the field effect transistor may be a N-type FET; and when a standard electrode potential of the first electrode is E1 and a standard electrode potential of the second electrode is E2, E1>E2 may be satisfied.

In this method, it becomes possible to attain the non-volatile memory element having a good rewrite characteristic, and integrate the non-volatile memory elements with a higher density by using the N-type MISFETs.

In the above driving method, the field effect transistor may be a P-type FET; and when a standard electrode potential of the first electrode is E1 and a standard electrode potential of the second electrode is E2, E2>E1 may be satisfied.

In this method, it becomes possible to attain the non-volatile memory element including the variable resistance element which is easily processed.

In the above driving method, the variable resistance layer may include: a first variable resistance layer comprising a first metal oxide; and a second variable resistance layer comprising a second metal oxide; the first metal oxide and the second metal oxide may be oxides of the same metal, and when a composition of the first metal oxide is expressed as $MO_x$ and a composition of the second metal oxide is expressed as $MO_y$, y>x may be satisfied.

In this method, it becomes possible to attain a stable resistance changing operation of the non-volatile memory element.

In the above driving method, each of the first metal oxide and the second metal oxide may be a tantalum oxide.

In this method, it becomes possible to attain a stable resistance changing operation of the non-volatile memory element.

In the above driving method, each of the first metal oxide and the second metal oxide may be a hafnium oxide.

In this method, it becomes possible to attain a stable resistance changing operation of the non-volatile memory element.

In the above driving method, each of the first metal oxide and the second metal oxide may be a zirconium oxide.

In this method, it becomes possible to attain a stable resistance changing operation of the non-volatile memory element.

In the above driving method, the variable resistance layer may include: a first variable resistance layer comprising a first metal oxide; and a second variable resistance layer comprising a second metal oxide; the first metal oxide and the second metal oxide may be oxides of different metals; and when a standard electrode potential of the metal constituting the first metal oxide is EN, and a standard electrode potential of the metal constituting the second metal oxide is EM, EN<EM may be satisfied.

In this method, it becomes possible to attain a more stable resistance changing operation of the non-volatile memory element than a case where the first metal oxide and the second metal oxide are oxides of the same metal.

In the above driving method, the first metal oxide may be a tantalum oxide and the second metal oxide may be an aluminum oxide.

In this method, it becomes possible to attain a stable resistance changing operation of the non-volatile memory element.

In the above driving method, the first metal oxide may be a tantalum oxide and the second metal oxide may be a hafnium oxide.

In this method, it becomes possible to attain a stable resistance changing operation of the non-volatile memory element.

The above driving method may comprise the steps of: (A) applying the first gate voltage to the gate terminal and applying the first write voltage pulse between the second electrode and the second input/output terminal, to change the variable resistance layer to the low-resistance state; and (B) when the variable resistance layer is not changed to the low-resistance state after the step (A), determining that the variable resistance layer is in an excess-resistance state, applying the second gate voltage to the gate terminal, and applying the second write voltage pulse between the second electrode and the second input/output terminal.

In this method, it becomes possible to efficiently change the non-volatile memory element in the excess-resistance state to the low-resistance state.

[Device Configuration]

<Configuration of Variable Resistance Element>

FIG. 1 is a cross-sectional view showing an exemplary schematic configuration of a variable resistance element included in a non-volatile memory element according to Embodiment 1.

In the example of FIG. 1, a variable resistance element 10 included in the non-volatile memory element according to Embodiment 1 includes a first electrode 2, a second electrode 4, and a variable resistance layer 3.

The variable resistance layer 3 is provided between the first electrode 2 and the second electrode 4, and reversibly changes its resistance state between the low-resistance state and the high-resistance state in which the resistance value is greater than that corresponding to the low-resistance state, in response to a voltage pulse applied between the first electrode 2 and the second electrode 4. The first electrode 2 and the variable resistance layer 3 are physically in contact with each other. The second electrode 4 and the variable resistance layer 3 are physically in contact with each other.

The variable resistance layer 3 reversibly switches its resistance state between the high-resistance state and the low-resistance state according to, for example, the polarity of the voltage applied between the first electrode 2 and the second electrode 4. In the example of FIG. 1, the variable resistance layer 3 is composed of at least two layers, which are a second variable resistance layer 3b connected to the first electrode 2 and a first variable resistance layer 3a connected to the second electrode 4 such that the second variable resistance layer 3b and the first variable resistance layer 3a are stacked together. However, the variable resistance layer 3 may not be necessarily composed of plural layers but may consist of a single (mono) layer.

The first variable resistance layer 3a comprises an oxygen-deficient first metal oxide, while the second variable resistance layer 3b comprises a second metal oxide which is lower in degree of oxygen deficiency than the first metal oxide. A minute localized region which reversibly changes the degree of oxygen deficiency by application of the electric pulse is formed in the second variable resistance layer 3b of the variable resistance element. It is considered that the localized region contains a filament formed by oxygen vacancy sites.

The term "degree of oxygen deficiency" refers to a ratio of an amount of oxygen which is deficient with respect to an amount of oxygen constituting an oxide having a stoichiometric composition (stoichiometric composition corresponding to a greatest resistance value in a case where there exist plural stoichiometric compositions) of each metal oxide. A metal oxide having a stoichiometric composition is more stable and has a greater resistance value than a metal oxide having another composition.

For example, in a case where the metal is tantalum (Ta), a tantalum oxide having a stoichiometric composition according to the above definition is $Ta_2O_5$, and therefore is expressed as $TaO_{2.5}$. The degree of oxygen deficiency of $TaO_{2.5}$ is 0%. The degree of oxygen deficiency of $TaO_{1.5}$, is (2.5−1.5)/

2.5=40%. An oxygen excess metal oxide has a negative value in degree of oxygen deficiency. In the present specification, the degree of oxygen deficiency is meant to include a positive value, 0 and a negative value unless otherwise explicitly noted.

An oxide which is lower in degree of oxygen deficiency is closer to the oxide having a stoichiometric composition and therefore has a greater resistance value, while an oxide which is higher in degree of oxygen deficiency is closer to the metal constituting the oxide and therefore has a smaller resistance value.

The term "oxygen content atomic percentage" refers to a ratio of the number of oxygen atoms to the total number of atoms. For example, the oxygen content atomic percentage of $Ta_2O_5$ is the ratio of the number of oxygen atoms to the total number of atoms (O/(Ta+O)) and is 71.4 atm %. Therefore, the oxygen content atomic percentage of the oxygen-deficient tantalum oxide is higher than 0 and lower than 71.4 atm %. For example, in a case where the metal constituting the first metal oxide and the metal constituting the second metal oxide are of the same kind, there is a correspondence between the oxygen content atomic percentage and the degree of oxygen deficiency. In this case, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

When x of $TaO_x$ of the composition of the first metal oxide constituting the first variable resistance layer 3a is equal to or greater than 0.8 and equal to or less than 1.9, and y of $TaO_y$ of the composition of the second metal oxide constituting the second variable resistance layer 3b is equal to or greater than 2.1, in a case where the variable resistance layer 3 comprises tantalum, the resistance value of the variable resistance layer 3 is allowed to change stably and at a high speed. In this case, the thickness of the second variable resistance layer 3b may be set equal to or greater than 1 nm and equal to or less than 8 nm.

As the metal constituting the variable resistance layer 3, a metal other than tantalum may be used. As the metal constituting the variable resistance layer 3, a transition metal, or aluminum (Al) may be used. As the transition metal, tantalum (Ta), titanium (Ti), hafnium (Hf), zirconium (Zr), niobium (Nb), tungsten (W), nickel (Ni), etc., may be used. Since the transition metal can assume plural oxidized states, different resistance states can be implemented by a redox reaction.

When x of $HfO_x$ of the composition of the first metal oxide is equal to or greater than 0.9 and equal to or less than 1.6, and y of $HfO_y$ of the composition of the second metal oxide is greater than x, in a case where the hafnium oxide is used, the resistance value of the variable resistance layer 3 is allowed to change stably and at a high speed. In this case, the thickness of the second metal oxide may be set to 1 to 5 nm.

When x of $ZrO_x$ of the composition of the first metal oxide is equal to or greater than 0.9 and equal to or less than 1.4, and y of $ZrO_y$ of the composition of the second metal oxide is greater than x, in a case where the zirconium oxide is used, the resistance value of the variable resistance layer 3 is allowed to change stably and at a high speed. In this case, the thickness of the second metal oxide may be set to 1 to 5 nm.

The first metal constituting the first metal oxide and the second metal constituting the second metal oxide may be different metals. In this case, the second metal oxide may be lower in degree of oxygen deficiency than the first metal oxide, i.e., higher in resistance than the first metal oxide. In such a configuration, a greater portion of a voltage applied between the first electrode and the second electrode to cause resistance change is fed to the second metal oxide, and the redox reaction taking place within the second metal oxide is facilitated.

In a case where the first metal constituting the first metal oxide which will become the first variable resistance layer 3a and the second metal constituting the second metal oxide which will become the second variable resistance layer 3b are materials which are different from each other, the standard electrode potential of the second metal may be lower than the standard electrode potential of the first metal. The standard electrode potential is a characteristic in which as its value is greater, the corresponding material is less easily oxidized. This allows the redox reaction to take place more easily in the second metal oxide which is relatively lower in standard electrode potential. It is estimated that in a resistance changing phenomenon, the redox reaction takes place in the minute localized region formed within the second metal oxide which is higher in resistance, the filament (conductive path) changes, and thereby its resistance value (degree of oxygen deficiency) changes.

For example, a stable resistance changing operation is attained by using an oxygen-deficient tantalum oxide ($TaO_x$) as the first metal oxide and by using a titanium oxide ($TiO_2$) as the second metal oxide. Titanium (standard electrode potential=1.63 eV) has a lower standard electrode potential than tantalum (standard electrode potential=−0.6 eV). By using as the second metal oxide an oxide of a metal having a lower standard electrode potential than the metal of the first metal oxide, the redox reaction easily takes place within the second metal oxide. As another combination, an aluminum oxide ($Al_2O_3$) may be used as the second metal oxide which will become the high-resistance layer. For example, an oxygen-deficient tantalum oxide ($TaO_x$) may be used as the first metal oxide, and the aluminum oxide ($Al_2O_3$) may be used as the second metal oxide.

It is estimated that in a resistance changing phenomenon in the variable resistance layer 3 having the stacked-layer structure, when the variable resistance layer 3 is changed to the high-resistance state or to the low-resistance state, the redox reaction takes place in the minute localized region formed within the second variable resistance layer 3b which is higher in resistance, the filament (conductive path) in the localized region changes, and thereby resistance value of the second variable resistance layer 3b changes.

Specifically, when a negative voltage is applied to the second electrode 4 on the basis of the first electrode 2, oxygen ions within the variable resistance layer 3 are drawn toward the second variable resistance layer 3b. Thereby, an oxidation reaction proceeds in the minute localized region formed within the second variable resistance layer 3b, and the degree of oxygen deficiency reduces. This may result in a situation in which connection of the filament in the localized region does not easily occur, and the resistance value increases.

Conversely, when a positive voltage is applied to the second electrode 4 on the basis of the first electrode 2, the oxygen ions within the second variable resistance layer 3b are forced to migrate toward the first variable resistance layer 3a. Thereby, a reduction reaction proceeds in the minute localized region formed within the second variable resistance layer 3b, and the degree of oxygen deficiency increases. This may result in a situation in which connection of the filament in the localized region easily occurs, and the resistance value decreases.

Each of the first electrode 2 and the second electrode 4 comprises, for example, one or a plurality of materials which is/are selected from Au (gold), Pt (platinum), Ir (iridium), Cu (copper), TiN (titanium nitride), and TaN (tantalum nitride).

The first electrode 2 connected to the second variable resistance layer 3b comprising the second metal oxide which is lower in degree of oxygen deficiency may comprise, for example, a material which is higher in standard electrode potential than the metal constituting the second metal oxide and the material constituting the second electrode 4, such as platinum (Pt), iridium (Ir), and palladium (Pd).

The second electrode 4 connected to the first variable resistance layer 3a comprising the first metal oxide which is higher in degree of oxygen deficiency may comprise, for example, a material which is lower in standard electrode potential than the metal constituting the first metal oxide, such as tungsten (W), nickel (Ni), tantalum (Ta), titanium (Ti), aluminum (Al), a tantalum nitride (TaN), and a titanium nitride (TiN). The standard electrode potential is a characteristic in which as its value is greater, the corresponding material is less easily oxidized.

Specifically, among a standard electrode potential E2 of the material constituting the second electrode 4, a standard electrode potential EM of the metal constituting the second metal oxide which will become the second variable resistance layer 3b, a standard electrode potential EN of the metal constituting the first metal oxide, and a standard electrode potential E1 of the material constituting the first electrode 2, EM<E1 and E2<E1 may be satisfied. Furthermore, E1>EM and EN≥E2 may be satisfied.

By the above described configuration, a redox reaction takes place selectively in a region within the second metal oxide which is in the vicinity of the interface between the first electrode 2 and the second variable resistance layer 3b, and hence a stable resistance changing phenomenon is attained.

In the example of FIG. 1, the variable resistance element 10 is formed on a substrate 1. The substrate 1 may comprises, for example, a silicon substrate. Note that the substrate 1 is not an essential element of the variable resistance element.

<Manufacturing Method of Variable Resistance Element>

Next, an exemplary manufacturing method of the variable resistance element 10 will be described.

Initially, on the substrate 1, a layer comprising a material (e.g., iridium (Ir)) constituting the first electrode 2 is deposited by sputtering.

Then, on this layer, a layer of the second metal oxide constituting the second variable resistance layer 3b is deposited. The layer of the second metal oxide may be deposited by, for example, sputtering using a tantalum oxide target in an atmosphere of an argon gas or in an atmosphere of the argon gas and an oxygen gas, or otherwise may be deposited by CVD (chemical vapor deposition), or ALD (atomic layer deposition).

Then, on the layer of the second metal oxide, the layer of the first metal oxide constituting the first variable resistance layer 3a is deposited. The layer of the first metal oxide may be deposited by, for example, reactive sputtering, in which sputtering is conducted using a Ta target in the atmosphere of the argon gas and the oxygen gas. The degree of oxygen deficiency of the first metal oxide may be adjusted by changing the flow rate ratio of the oxygen gas with respect to the argon gas in the sputtering. Note that the substrate need not be especially heated but the first metal oxide may be deposited as a layer under a state in which a temperature of the substrate is a room temperature.

Then, on the layer of the first metal oxide, a layer of a material (e.g., tantalum nitride (TaN)) constituting the second electrode 4 is deposited by sputtering.

The layer of the first electrode material, the layer of the second metal oxide, the layer of the first metal oxide, and the layer of the second electrode material, are patterned, to form the first electrode 2, the second variable resistance layer 3b, the first variable resistance layer 3a, and the second electrode 4, each of which has a desired size and a desired shape.

Through the above described steps, the variable resistance element 10 is obtained.

<Configuration of Non-Volatile Memory Element>

Figure 2A:
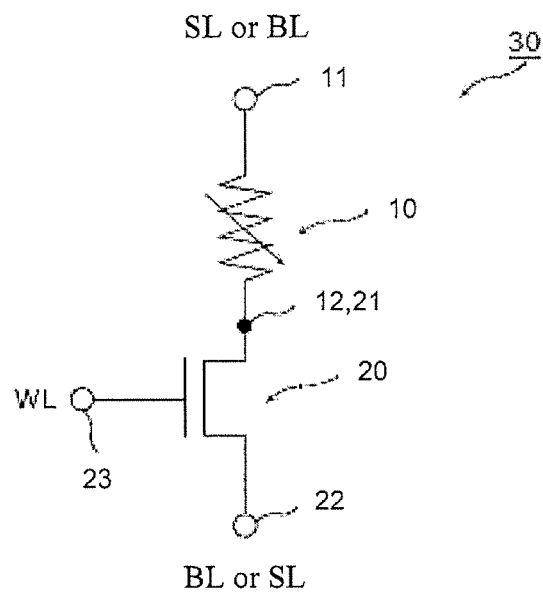
FIG. 2A is an equivalent circuit diagram showing an exemplary non-volatile memory element according to Embodiment 1.

FIG. 2A is an equivalent circuit diagram showing an exemplary non-volatile memory element according to Embodiment 1. In the example of FIG. 2A, the non-volatile memory element according to Embodiment 1 is a 1T1R non-volatile memory element, which includes one transistor and one variable resistance element.

A non-volatile memory element 30 includes the variable resistance element 10 and a field effect transistor 20. The variable resistance element 10 has been described above, and will not be described in detail repeatedly.

The field effect transistor 20 includes a first input/output terminal 21 connected to the first electrode 2, a second input/output terminal 22, and a gate terminal 23 for controlling electric conduction between the first input/output terminal 21 and the second input/output terminal 22.

WL indicates word lines, SL indicates source lines, and BL indicates bit lines. The field effect transistor 20 is a switching unit for performing switching between selection and non-selection of the non-volatile memory element 30, and is a control unit for controlling the value of the current flowing through the non-volatile memory element 30.

Figure 2B:
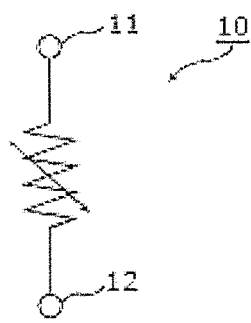
FIG. 2B is an equivalent circuit diagram showing an exemplary variable resistance element according to Embodiment 1.

FIG. 2B is an equivalent circuit diagram showing an exemplary variable resistance element according to Embodiment 1.

As shown in FIG. 2B, the variable resistance element 10 is an element having a two-terminal structure, including two terminals connected to the second electrode 4 and the first electrode 1, respectively. One of the terminals of the variable resistance element 10 is connected to one of the terminals of the field effect transistor 20. In the present disclosure, one of the two terminals of the variable resistance element 10, which is connected to the field effect transistor 20, will be referred to as a second terminal 12, while the other of the two terminals of the variable resistance element 10, which is not connected to the field effect transistor 20, will be referred to as a first terminal 11.

Figure 2C:
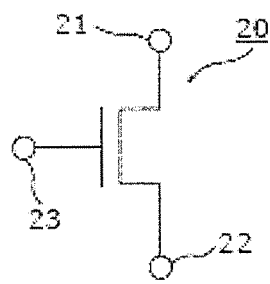
FIG. 2C is an equivalent circuit diagram showing an exemplary field effect transistor according to Embodiment 1.

FIG. 2C is an equivalent circuit diagram showing an exemplary field effect transistor according to Embodiment 1.

As shown in FIG. 2C, the field effect transistor 20 is an element including at least three terminals, which are a source terminal, a drain terminal and a gate terminal. In the present disclosure, the terminal of these three terminals, which is connected to the variable resistance element 10, will be referred to as the first input/output terminal 21, and the terminal which is electrically connectable to the first input/output terminal 21 by the operation of the transistor, will be referred to as the second input/output terminal 22. Also, the terminal for controlling electric conduction between the first input/output terminal 21 and the second input/output terminal 22 in the operation of the transistor, will be referred to as the gate terminal 23.

The field effect transistor 20 is configured such that, in an ON-state, one of the first input/output terminal 21 and the second input/output terminal 22 serves as the source terminal and the other of the first input/output terminal 21 and the second input/output terminal 22 serves as the drain terminal. As will be described later, which of the first input/output terminal 21 and the second input/output terminal 22 is the source terminal (or drain terminal) is determined by a flow direction of a current and polarity of carriers.

The field effect transistor 20 may be, for example, one of a MISFET (metal-insulator-semiconductor field-effect transistor) and a MOSFET (metal-oxide semiconductor field-effect transistor) which is one kind of the MISFET.

For simplified description, the field effect transistor 20 will be sometimes simply referred to as a transistor 20. Or, the field effect transistor 20 will be sometimes referred to as a MISFET 20, a N-type MISFET 20 or a P-type MISFET 20, according to specific examples.

Regarding the examples of FIGS. 2B and 2C, the variable resistance element 10 and the field effect transistor 20 are individually described. This is a circuit diagram representation for simplified description. Therefore, for example, the variable resistance element 10 and the field effect transistor 20 may be integrated as a device.

For example, the first input/output terminal 21 of the field effect transistor 20 may also serve as the first electrode 2 of the variable resistance element 10. The second terminal 12 of the variable resistance element 10 and the first input/output terminal 21 of the field effect transistor 20 may be electrically connected to each other. For example, another conductive member may be interposed between the variable resistance element 10 and the field effect transistor 20.

Figure 3:
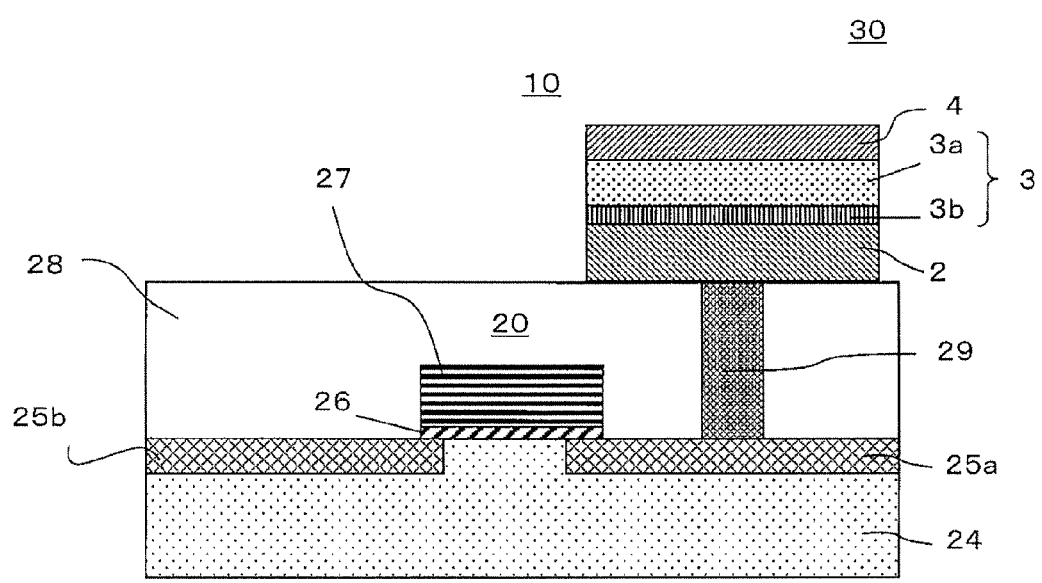
FIG. 3 is a cross-sectional view showing an exemplary schematic configuration of the non-volatile memory element according to Embodiment 1.

FIG. 3 is a cross-sectional view showing an exemplary schematic configuration of the non-volatile memory element according to Embodiment 1.

In the example of FIG. 3, the non-volatile memory element 30 includes the variable resistance element 10 and the field effect transistor 20. FIG. 3 shows as an example, a case where the field effect transistor 20 is the N-type MISFET.

When the field effect transistor 20 is the N-type MISFET, majority carriers are electrons. In contrast, when the field effect transistor 20 is the P-type MISFET, majority carriers are holes.

In general, the mobility of the electrons is higher than the mobility of the holes. In a case where the MISFETs 20 of the same size are fabricated by the same structure (material and thickness) of a gate insulating layer 26, the N-type MISFET has a higher current drivability than the P-type MISFET. Because of this, in a case where the MISFETs 20 having an equal current drivability are fabricated, the N-type MISFETs make it possible to reduce an element size and integrate the non-volatile memory elements 30 with a higher density.

As in the variable resistance element 10 of FIG. 1, the variable resistance element 10 includes the first electrode 2, the variable resistance layer 3 and the second electrode 4. The variable resistance layer 3 includes the first variable resistance layer 3*a* and the second variable resistance layer 3*b*. When a voltage pulse with a polarity which provides a negative voltage to the second electrode 4 on the basis of the first electrode 2, is applied to the variable resistance layer 3, the variable resistance layer 3 is changed to the high-resistance state. Conversely, when a voltage pulse with a polarity which provides a positive voltage to the second electrode 4 on the basis of the first electrode 2, is applied to the variable resistance layer 3, the variable resistance layer 3 is changed to the low-resistance state.

The N-type MISFET 20 includes a semiconductor substrate 24, a first diffusion layer 25*a* and a second diffusion layer 25*b* which are disposed on the semiconductor substrate 24, the gate insulating layer 26 disposed on the semiconductor substrate 24 such that the gate insulating layer 26 extends like a bridge over a portion of the first diffusion layer 25*a* and a portion of the second diffusion layer 25*b* (the gate insulating layer 26 overlaps with a portion of the first diffusion layer 25*a* and a portion of the second diffusion layer 25*b* when viewed from a thickness direction of the semiconductor substrate 24), and a gate electrode 27 disposed on the gate insulating layer 26. In a case where the gate insulating layer 26 is an oxide layer, the N-type MISFET 20 is also referred to as N-type MOSFET.

The MISFET 20 can be fabricated by various known methods. An interlayer insulating layer 28 is formed on the N-type MISFET 20. A conductive via 29 connecting the first electrode 2 of the variable resistance element 10 to the first diffusion layer 25*a* of the MISFET 20 is formed to so as penetrate the interlayer insulating layer 28.

In the N-type MISFET 20, the conductive type of the semiconductor substrate 24 is opposite to the conductive type of the first diffusion layer 25*a* and of the second diffusion layer 25*b*. When the semiconductor substrate 24 is of P-type, the first diffusion layer 25*a* and the second diffusion layer 25*b* are of N-type. In this case, the MISFET 20 is of N-type. By comparison, when the semiconductor substrate 24 is of N-type, the first diffusion layer 25*a* and the second diffusion layer 25*b* are of P-type. In this case, the MISFET 20 is of P-type.

FIGS. 2A and 3 show a connection relationship in a case where the MISFET 20 is the N-type MISFET 20. As will be described later, in a case where the MISFET 20 is the P-type MISFET 20, the connection relationship is established such that a correspondence between the polarity of the voltage applied to the variable resistance layer 3 and the direction in which the resistance value of the variable resistance layer 3 changes (the low-resistance state is written or the high-resistance state is written) is opposite to a correspondence in a case where the MISFET 20 is the N-type MISFET 20. For example, in a case where the variable resistance layer 3 has a vertically non-symmetric structure, the variable resistance layer 3 may be placed such that the vertical positional relationship of the constituents of the variable resistance layer 3 in the case where the MISFET 20 is the P-type MISFET 20 is opposite to the vertical positional relationship of the constituents of the variable resistance layer 3 in the case where the MISFET 20 is the N-type MISFET 20. Also, in a case where the first electrode 2 and the second electrode 4 comprise materials which are different from each other, the material of the first electrode 2 and the material of the second electrode 4 in the case where the MISFET 20 is the P-type MISFET 20 may be reversed in vertical positional relationship with respect to the material of the first electrode 2 and the material of the second electrode 4 in the case where the MISFET 20 is the N-type MISFET 20.

The cross-sectional structure of the non-volatile memory element 30 shown in FIG. 3 is merely exemplary. The structure of the variable resistance element 10, the structure of the field effect transistor 20 and the structure of a connection portion between the variable resistance element 10 and the field effect transistor 20, in the non-volatile memory element 30 of the present embodiment, are not limited to those shown in FIG. 3. For simplified description, hereinafter, the field effect transistor 20 of FIGS. 2A and 3 will be N-type MISFET 20 unless otherwise noted.

When the standard electrode potential of the first electrode 2 is E1 and the standard electrode potential of the second electrode 4 is E2 in the non-volatile memory element 30 of FIG. 3, E1>E2 may be satisfied. When such a requirement of the standard electrode potential is satisfied, a resistance changing phenomenon stably occurs in the vicinity of the interface between the first electrode 2 and the second variable resistance layer 3*b*.

When the standard electrode potential of the first electrode 2 is E1 and the standard electrode potential of the second electrode 4 is E2, in a case where the variable resistance layer 3 is composed of a single (mono) layer, E1>E2 may be satisfied. When such a requirement of the standard electrode potential is satisfied, the resistance changing phenomenon stably occurs in the vicinity of the interface between the first electrode 2 and the variable resistance layer 3. In such a case, when a voltage pulse with a polarity which provides a negative voltage to the second electrode 4 on the basis of the first electrode 2, is applied to the variable resistance layer 3, the variable resistance layer 3 is changed to the high-resistance state. Conversely, when a voltage pulse with a polarity which provides a positive voltage to the second electrode 4 on the basis of the first electrode 2, is applied to the variable resistance layer 3, the variable resistance layer 3 is changed to the low-resistance state. Thus, by setting the connection relationship between the electrodes and the input/output terminals of the transistor 20 in a manner similar to that described above, a driving method using voltage pulses with polarities similar to those described later may be employed.

[Driving Method]

Next, the driving method of the non-volatile memory element 30 configured as described above will be described.

<Outline>

Hereinafter, a state in which the resistance value of the variable resistance element 10 is a specified great value (e.g., 500000Ω) will be referred to as the high-resistance state and a state in which the resistance value of the variable resistance element 10 is a specified small value (e.g., 10000Ω) will be referred to as the low-resistance state. Also, in the present description, in some cases, an event that the variable resistance element 10 (variable resistance layer 3) is changed from the high-resistance state to the low-resistance state will be referred to writing of the low-resistance state, and an event that the variable resistance element 10 (variable resistance layer 3) is changed from the low-resistance state to the high-resistance state will be referred to writing of the high-resistance state.

In the present embodiment, by applying a voltage to the non-volatile memory element 30 using a power supply or the like, the resistance state of the variable resistance layer 3 can be changed as follows.

Firstly, by applying a voltage pulse (write voltage pulse) with a second polarity, a voltage value of VLR1 and a pulse width of PWLR between the first terminal 11 of the variable resistance element 10 and the second input/output terminal 22 of the transistor 20, the variable resistance layer 3 is changed from the high-resistance state to the low-resistance state. Hereinafter, this will be referred to as a writing step. In the present description, the second polarity means the polarity of the voltage pulse required to change the variable resistance layer 3 from the high-resistance state to the low-resistance state.

For example, in the case of the connection relationship of FIGS. 2A and 3, the polarity of the voltage which allows the electric potential of the second electrode 4 within the variable resistance element 10 to be relatively higher than the electric potential of the second diffusion layer 25b of the N-type MISFET 20, is the second polarity. In this case, the voltage applied to the variable resistance element 10 is the voltage with the polarity which provides the negative voltage to the first electrode 2 on the basis of the second electrode 4, and therefore, the variable resistance layer 3 is changed from the high-resistance state to the low-resistance state.

Then, a voltage pulse (erase voltage pulse) with a first polarity which is different from the second polarity, a voltage value of VHR and a pulse width of PWHR is applied between the first terminal 11 of the variable resistance element 10 and the second input/output terminal 22 of the transistor 20. This allows the variable resistance layer 3 to be changed from the low-resistance state to the high-resistance state. Hereinafter, this will be referred to as an erasing step. In the present description, the first polarity means the polarity of the voltage pulse required to change the variable resistance layer 3 from the low-resistance state to the high-resistance state.

For example, in the case of the connection relationship of FIGS. 2A and 3, the polarity of the voltage which allows the electric potential of the second electrode 4 within the variable resistance element 10 to be relatively lower than the electric potential of the second diffusion layer 25b of the N-type MISFET 20, is the first polarity. In this case, the voltage applied to the variable resistance element 10 is the voltage with the polarity which provides the positive voltage to the first electrode 2 on the basis of the second electrode 4, and therefore, the variable resistance layer 3 is changed from the low-resistance state to the high-resistance state.

By repeating the above described writing step and erasing step, the non-volatile memory element 30 operates. The pulse width PWLR and the pulse with PWHR may be each set to, for example, 50 ns.

It can be determined whether the variable resistance layer 3 is in the low-resistance state or in the high-resistance state, by applying a predetermined voltage pulse for reading (hereinafter will be referred to as a read voltage pulse).

The magnitude (absolute value) of the value of the voltage applied to the variable resistance element 10 using the read voltage pulse is smaller than a threshold voltage which causes the variable resistance layer 3 to change its resistance state. Because of this, the read voltage pulse does not affect the resistance state of the variable resistance element 10. For example, even if the read voltage pulse with the first polarity is applied to the variable resistance element 10 and the transistor 20 (applied between the first terminal 11 and the second input/output terminal 22) in a state in which the variable resistance layer 3 is in the low-resistance state, the resistance state of the variable resistance layer 3 is not changed, and the variable resistance layer 3 is retained in the low-resistance state. In the same manner, even if the read voltage pulse with the second polarity is applied to the variable resistance element 10 and the transistor 20 (applied between the first terminal 11 and the second input/output terminal 22) in a state in which the variable resistance layer 3 is in the high-resistance state, the resistance state of the variable resistance layer 3 is not changed, and the variable resistance layer 3 is retained in the high-resistance state.

By applying the above described driving method to the non-volatile memory element 30 of the present embodiment, the non-volatile memory element 30 can be used as one memory cell. For example, assuming that a case where the variable resistance layer 3 is in the low-resistance state corresponds to "1" and a case where the variable resistance layer 3 is in the high-resistance state corresponds to "0," a 1-bit memory cell can be implemented.

<Connection Relationship Between Variable Resistance Element and Transistor in Non-Volatile Memory Element>

The non-volatile memory element 30 of the present embodiment is configured such that the variable resistance element 10 and the field effect transistor 20 are connected to each other such that the second input/output terminal 22 becomes the source terminal in the writing step (writing of the low-resistance state). In other words, in the writing step, one of the terminals of the field effect transistor 20 which is connected to the variable resistance element 10 becomes the drain terminal.

In the present description, the term "source" means a supply source of the majority carriers in the field effect transistor 20. By comparison, the term "drain" means a drain port of the majority carriers in the field effect transistor 20. When one of the first input/output terminal 21 and the second input/output terminal 22 is the source terminal, the other is the drain terminal. Likewise, when one of the first diffusion layer 25a and the second diffusion layer 25b is a source region, the other of these is a drain region. When the field effect transistor 20 is of N-type, the majority carriers are electrons. By comparison, when the field effect transistor 20 is of P-type, the majority carriers are holes.

In a case where a current flows bidirectionally like the field effect transistor 20 of the present embodiment, switching between the source and the drain takes place depending on the direction in which the current flows. In the present embodiment, since the polarity of the voltage applied to the non-volatile memory element 30 in the writing step is opposite to the polarity of the voltage applied to the non-volatile memory element 30 in the erasing step, the source and the drain are reversed correspondingly. In other words, the source and drain in the writing step are the drain and source in the erasing step, respectively.

When an ON-current flows from the first input/output terminal 21 to the second input/output terminal 22 in a case where the field effect transistor 20 is the N-type MISFET 20, the first input/output terminal 21 is the drain terminal and the second input/output terminal 22 is the source terminal. On the other hand, when the ON-current flows from the second input/output terminal 22 to the first input/output terminal 21 in a case where the field effect transistor 20 is the N-type MISFET 20, the first input/output terminal 21 is the source terminal and the second input/output terminal 22 is the drain terminal.

When the ON-current flows from the first input/output terminal 21 to the second input/output terminal 22 in a case where the field effect transistor 20 is the P-type MISFET 20, the first input/output terminal 21 is the source terminal and the second input/output terminal 22 is the drain terminal. On the other hand, when the ON-current flows from the second input/output terminal 22 to the first input/output terminal 21 in a case where the field effect transistor 20 is the P-type MISFET 20, the first input/output terminal 21 is the drain terminal and the second input/output terminal 22 is the source terminal.

In a case where the field effect transistor 20 is the N-type MISFET 20, the write voltage pulse applied to the non-volatile memory element 30 of FIGS. 2A and 3 in the writing step is, as described above, the voltage pulse which allows the electric potential (electric potential of the first terminal 11) of the second electrode 4 within the variable resistance element 10 to be relatively higher than the electric potential (electric potential of the second input/output terminal 22) of the second diffusion layer 25b of the N-type MISFET 20. In this case, the current flows through the first terminal 11, the second terminal 12, the first input/output terminal 21 and the second input/output terminal 22, sequentially in this order. At this time, the majority carries flowing through the N-type MISFET 20 are the electrons. Therefore, in the writing step, the second input/output terminal 22 of the N-type MISFET 20 becomes the source terminal.

In the same manner, since the polarity of the voltage of the erase voltage pulse applied to the non-volatile memory element 30 of FIGS. 2A and 3 in the erasing step is opposite to the polarity of the voltage applied to the non-volatile memory element 30 in the writing step, the first input/output terminal 21 of the N-type MISEFT 20 becomes the source terminal.

The vertical positional relationship of the constituents of the variable resistance element 10 in the case where the field effect transistor 20 is the P-type MISFET 20 is opposite to the vertical positional relationship of the constituents of the variable resistance element 10 in the case where the field effect transistor 20 is the N-type MISFET 20 (see modified example). Therefore, the write voltage pulse applied to the non-volatile memory element 30 in the writing step is the voltage pulse which allows the electric potential (electric potential of the first terminal 11) of the second electrode 4 within the variable resistance element 10 to be relatively lower than the electric potential (electric potential of the second input/output terminal 22) of the second diffusion layer 25b of the P-type MISFET 20. In this case, the current flows through the second input/output terminal 22, the first input/output terminal 21, the second terminal 12 and the first terminal 11 sequentially in this order. At this time, the majority carries flowing through the P-type MISFET 20 are the holes. Therefore, in the writing step, the second input/output terminal 22 of the P-type MISFET 20 becomes the source terminal.

In the same manner, since the polarity of the voltage of the erase voltage pulse applied to the non-volatile memory element 30 in the erasing step is opposite to the polarity of the voltage applied to the non-volatile memory element 30 in the writing step, the first input/output terminal 21 of P-type MISFET 20 becomes the source terminal.

<Driving Method of Non-Volatile Memory Element in Writing Step and Body Effect>

Hereinafter, the relation between the writing operation of the non-volatile memory element 30 of the present embodiment and the body effect will be described with reference to FIGS. 2A and 3. Although the influence of the body effect in a case where the field effect transistor 20 is the N-type MISFET 20, will be exemplarily described below, the present disclosure is not limited to the case where the field effect transistor 20 is the N-type MISFET 20, as will be described later.

When the write voltage pulse is applied to the non-volatile memory element 30 in the writing step, a relatively high electric potential is applied to the first terminal 11 of the variable resistance element 10, and a relatively low electric potential is applied to the second input/output terminal 22 of the N-type MISFET 20. The voltage value of a first write voltage pulse VL1 which is an electric potential difference in this case is expressed as VLR1. By applying a first gate voltage (voltage (absolute value): VG1) to the gate terminal 23 at the same time, the N-type MISFET is ON. At this time, the source electric potential (electric potential of the second input/output terminal 22) of the N-type MISFET 20 is not affected by a voltage drop associated with the variable resistance element 10, but is determined by the electric potential applied to the second input/output terminal 22.

This is due to the fact that the source terminal (second input/output terminal 22) of the N-type MISFET 20 is located at one of the both ends of the non-volatile memory element 30 (this terminal is not the terminal connected to the variable resistance element). The source electric potential (electric potential of the second input/output terminal 22) of the N-type MISFET 20 is, for example, retained at an electric potential which is substantially equal to the electric potential of the semiconductor substrate 24. Because of this, the influence of the body effect on the N-type MISFET 20 is less, and the value of the ON-current of the N-type MISFET 20 can be controlled accurately by controlling the gate voltage.

<Driving Method of Non-Volatile Memory Element in Erasing Step>

Figure 9:
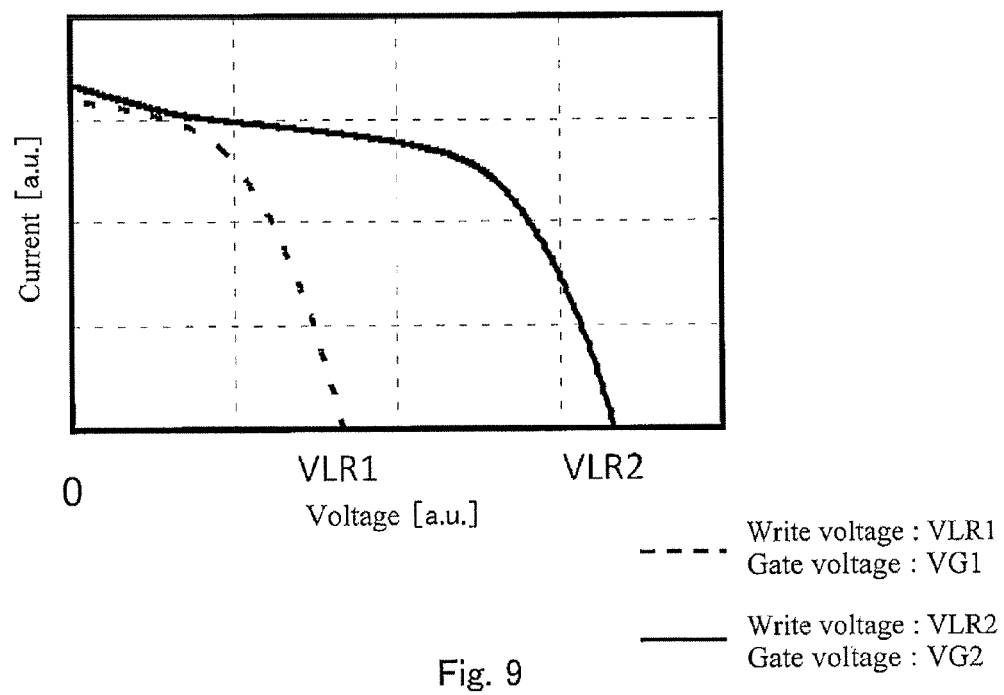
FIG. 9 is a view showing a load curve of the N-type MISFET in a case where the gate voltage is changed according to the write voltage, in the non-volatile memory element according to the experiment example.

When the erase voltage pulse is applied to the non-volatile memory element 30 in the erasing step, a relatively low electric potential is applied to the first terminal 11 of the variable resistance element 10, and a relatively high electric potential is applied to the second input/output terminal 22 of the N-type MISFET 20. At this time, the absolute value of the source electric potential (electric potential of the first input/output terminal 21) of the N-type MISFET 20 is relatively greater than the value of the electric potential of the semiconductor substrate 24. This increases the influence of the body effect, and results in a load curve of the N-type MISFET 20, as schematically shown in FIG. 9. In other words, in the erasing step, the N-type MISFET 20 operates as a source follower circuit. The voltage applied between the first terminal 11 and the second terminal 12 may be set lower than the voltage applied to the gate terminal 23.

<Driving Method of the Present Embodiment>

The driving method of the non-volatile memory element of the present embodiment has features as described below.

(1) When the variable resistance layer 3 is changed from the low-resistance state to the high-resistance state, the erase voltage pulse with the first polarity is applied between the second electrode 4 and the second input/output terminal 22.

(2) When the variable resistance layer 3 is changed from the high-resistance state to the low-resistance state, the write voltage pulse with the second polarity which is different from the first polarity is applied between the second electrode 4 and the second input/output terminal 22.

(3) The second polarity is such that the second input/output terminal 22 of the field effect transistor 20 becomes the source terminal.

(4) In a case where the first write voltage pulse is applied between the second electrode 4 and the second input/output terminal 22 to change the variable resistance layer 3 in the high-resistance state to the low-resistance state, the first gate voltage is applied to the gate terminal 23 of the field effect transistor 20.

(5) In a case where a second write voltage pulse which is greater in absolute value of voltage than the first write voltage pulse is applied between the second electrode 4 and the second input/output terminal 22 to change the variable resistance layer 3 in the excess-resistance state to the low-resistance state, a second gate voltage which is smaller in absolute value than the first gate voltage is applied to the gate terminal 23 of the field effect transistor 20.

Figure 4:
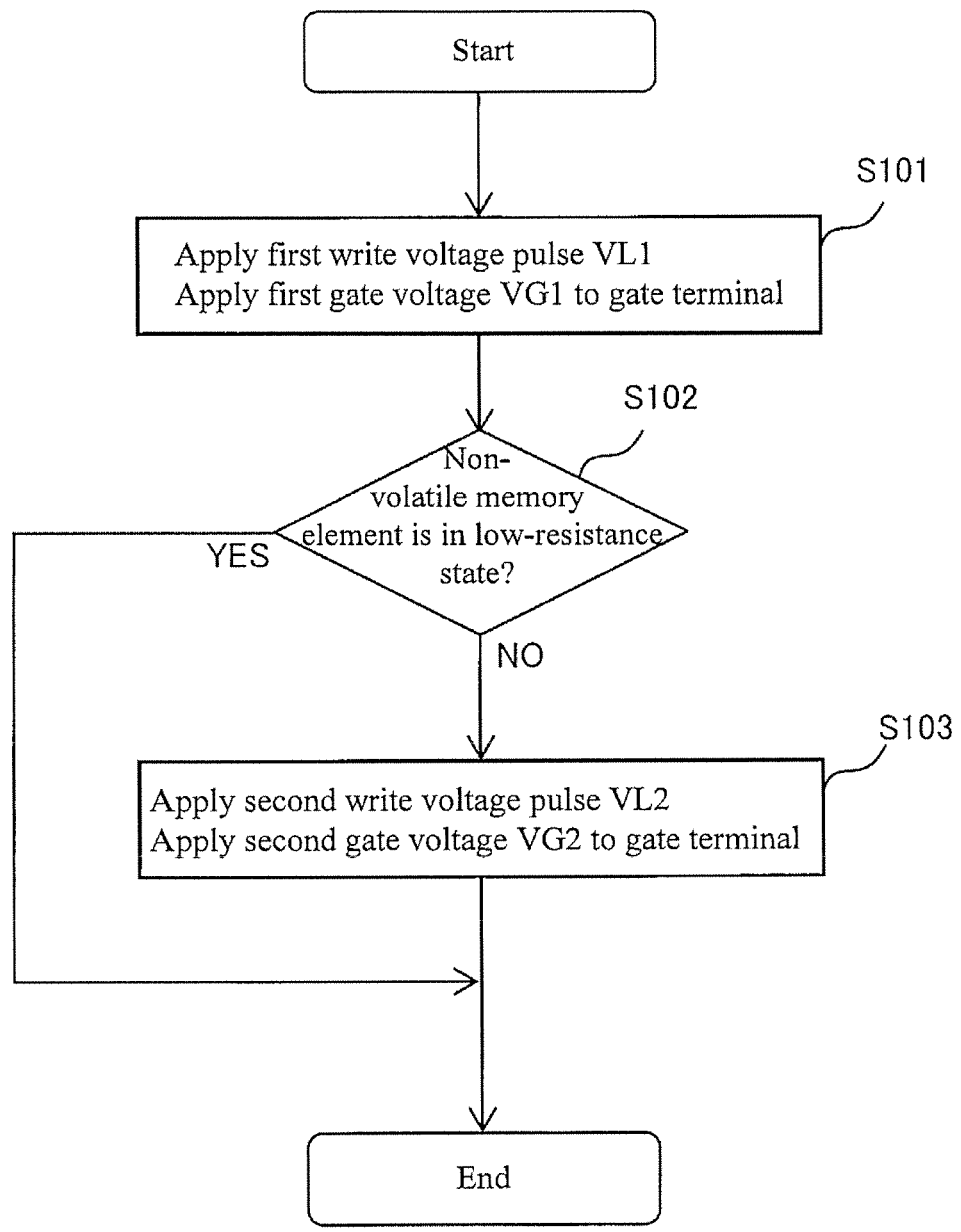
FIG. 4 is a flowchart showing an exemplary driving method of the non-volatile memory element according to Embodiment 1.

FIG. 4 is a flowchart showing an exemplary driving method of the non-volatile memory element according to Embodiment 1. Now, the driving method of the non-volatile memory element of the present embodiment will be described with reference to FIG. 4.

When writing of the low-resistance state in the non-volatile memory element starts (Start), the first write voltage pulse VL1 is firstly applied between the second electrode 4 and the second input/output terminal 22, and the first gate voltage VG1 is applied to the gate terminal 23 (step S101). The order in which the first write voltage pulse VL1 is applied and the first gate voltage VG1 is applied is not particularly limited. For example, the application of the first write voltage pulse VL1 may be started after the application of the first gate voltage VG1 is started, and the application of the first gate voltage VG1 may be ended after the application of the first write voltage pulse VL1 is ended.

Thereafter, it is determined whether or not the non-volatile memory element 30 is in the low-resistance state (step S102). If a result of the determination in step S102 is YES, writing is ended (End).

If a result of the determination in step S102 is NO, it is determined that the non-volatile memory element 30 is in the excess-resistance state. To resolve this, the second write voltage pulse VL2 is applied between the second electrode 4 and the second input/output terminal 22, and the second gate voltage VG2 is applied to the gate terminal 23 (step S103). When the voltage value (absolute value) of the first write voltage pulse VL1 is VLR1 and the voltage value (absolute value) of the second write voltage pulse VL2 is VLR2, VLR2>VLR1 is satisfied. In addition, VG1>VG2 is satisfied.

Since the write voltage pulse which is greater in voltage magnitude than the write voltage pulse applied in step S101 is applied, the non-volatile memory element 30 is easily changed to the low-resistance state. At this time, current compliance (steering) is performed using the transistor, by setting the gate voltage lower than the gate voltage in step S101. This can reduce a possibility that an excess current flows through the non-volatile memory element 30. As a result, it becomes possible to lessen the non-uniformity of the resistance values which would be caused by an event that an excess current flows through the non-volatile memory element 30, when the non-volatile memory element 30 is changed to the low-resistance state.

In the above example, it is determined whether or not the non-volatile memory element 30 is in the low-resistance state after the first write voltage pulse is applied, and it is determined that the non-volatile memory element 30 is in the excess-resistance state if a result of the determination is NO. Alternatively, it may be determined whether or not the non-volatile memory element 30 is in the excess-resistance state by another method. For example, it may be determined whether or not the non-volatile memory element 30 is in the excess-resistance state, based on a detected resistance value of the non-volatile memory element 30.

In accordance with the driving method of the present embodiment, a good rewrite characteristic of the variable resistance element can be maintained. As a result, a stable storing operation can be achieved.

Experiment Example

A non-volatile memory element having a configuration similar to that described in Embodiment 1 was fabricated, the non-volatile memory element was caused to perform a resistance changing operation, and the non-uniformity of the resistance values was studied. Specifically, the non-volatile memory element was configured as follows.

The size of each of the second electrode 4 and the variable resistance layer 3 was set to 0.5 μm×0.5 μm (area 0.25 μm$^2$). The size of a portion of the first electrode 2 and a portion of the variable resistance layer 3 which portions were in contact with each other was also set to 0.5 μm×0.5 μm (area 0.25 μm$^2$). The thickness of each of the second electrode 4 and the first electrode 2 was set to 50 nm.

The composition of the first metal oxide used as the first variable resistance layer 3a was set to TaO$_x$ (x=1.6). The composition of the second metal oxide used as the second variable resistance layer 3b was set to TaO$_y$ (y=2.47). The thickness of the variable resistance layer 3 was set to 50 nm, the thickness of the first variable resistance layer 3a was set to 44 nm, and the thickness of the second variable resistance layer 3b was set to 6 nm.

Regarding the field effect transistor 20, silicon was used as a substrate material, a silicon oxide was used as the material of the gate insulating layer 26, and the width of the gate insulating layer 26 was set to 0.44 μm. Polysilicon was used as the material of the gate electrode 27.

Figure 5:
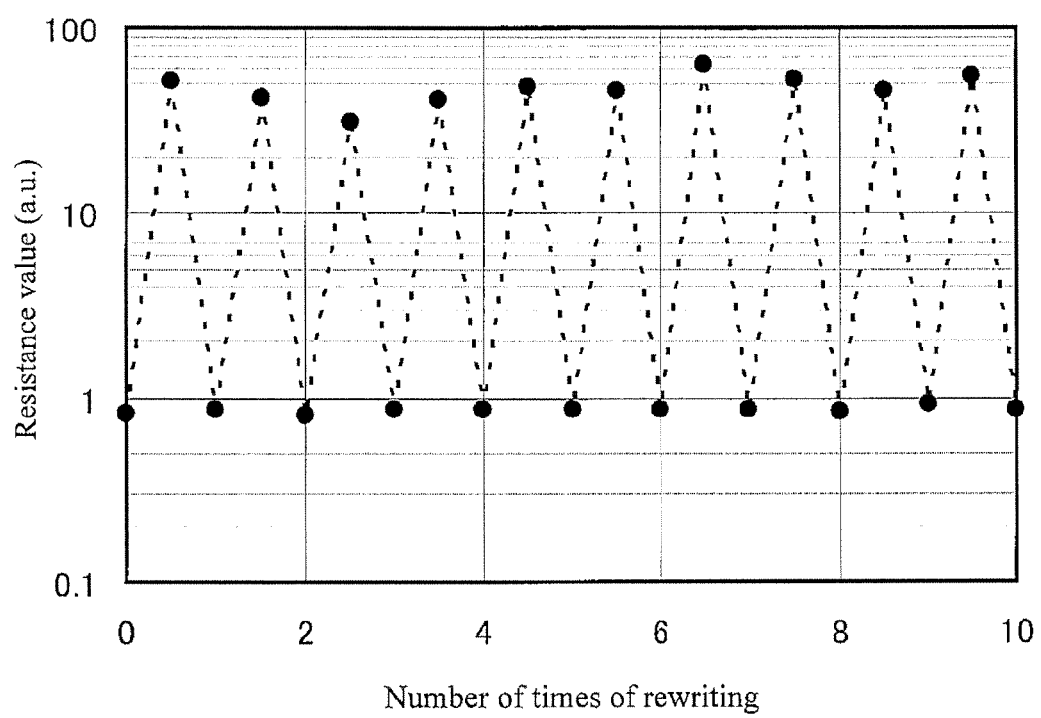
FIG. 5 is a view showing an exemplary resistance changing operation of a non-volatile memory element according to an experiment example.

FIG. 5 is a view showing an exemplary resistance changing operation of the variable resistance element 10 according to the experiment example. The number of times of the resistance changing operation shown in FIG. 5 was 10 times. A current flowed to change the variable resistance element 10 to the low-resistance state was set to 200 μA. As can be clearly seen from FIG. 5, the resistance value of the variable resistance element 10, corresponding to each of the high-resistance state and the low-resistance state, was not set to a constant resistance value.

Figures 6A, 6B:
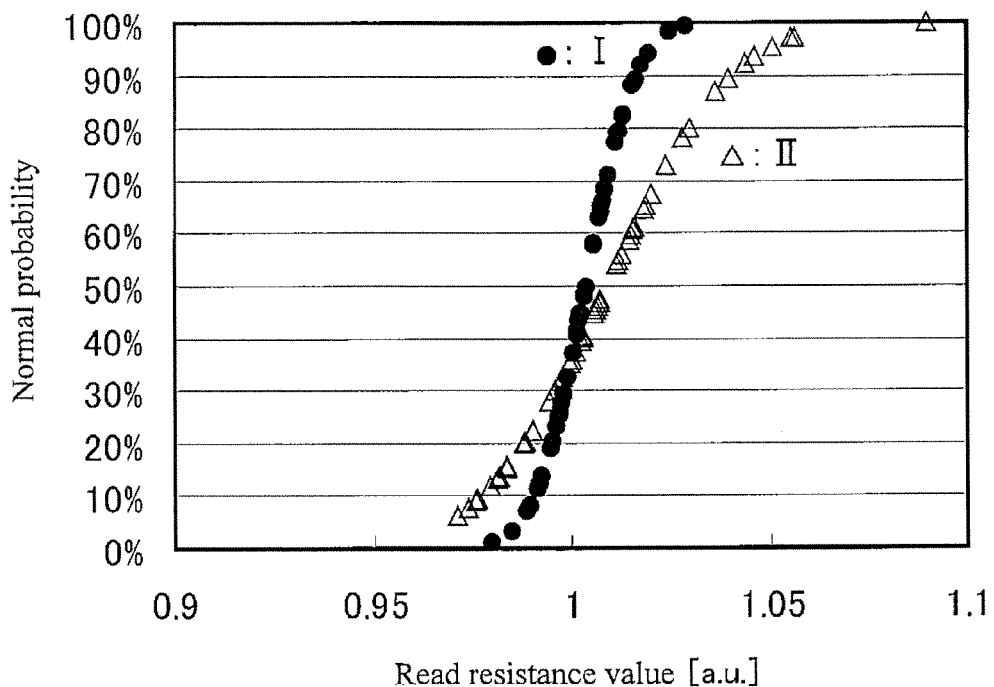
FIG. 6A is a view used for making a comparison of non-uniformity of resistance values in the non-volatile memory element according to the experiment example.
FIG. 6B is a flowchart corresponding to the experiment example.

FIG. 6A is a view used for making a comparison of the non-uniformity of the resistance values of the non-volatile memory element according to the experiment example. FIG. 6B is a flowchart of the experiment example.

In the present experiment example, firstly, the non-volatile memory element 30 was caused to perform the resistance changing operation 50 times under the state in which the current flowed when the non-volatile memory element 30 was changed to the low-resistance state was set to 200 μA (I of FIG. 6B). Then, the non-volatile memory element 30 was changed from the high-resistance state to the low-resistance state under the state in which the current flowed when the non-volatile memory element 30 was changed to the low-resistance state was set to 300 μA. Lastly, the non-volatile memory element 30 was caused to perform the resistance changing operation 50 times under the state in which the current flowed when the non-volatile memory element 30 was changed to the low-resistance state was set to 200 μA again (II of FIG. 6B).

In FIG. 6A, black circles (●) indicate a distribution (normal probability) of the resistance values corresponding to the low-resistance state, of the non-volatile memory element 30, in a case where the non-volatile memory element 30 was initially caused to perform the resistance changing operation 50 times under the state in which the current flowed when the non-volatile memory element 30 was changed to the low-resistance state was set to 200 μA (I of FIG. 6B).

In FIG. 6A, while triangles (Δ) indicate a distribution (normal probability) of the resistance values corresponding to the low-resistance state, of the non-volatile memory element 30, in a case where the non-volatile memory element 30 was caused to perform the resistance changing operation to write the low-resistance state under the state in which the current was set to 300 μA and then caused to perform the resistance changing operation 50 times under the state in which the current for writing the low-resistance state was set to 200 μA (II of FIG. 6B).

As can be clearly seen from FIG. 6A, even though the non-volatile memory element 30 was changed to the low-resistance state with an equal current value, in the state after the non-volatile memory element 30 was changed to the low-resistance state by applying a high current, the non-uniformity of the resistance values was greater than in the state before the non-volatile memory element 30 was changed to the low-resistance state by applying a high current. In other words, the distribution of the read resistance values corresponding to the low-resistance state was greater as a result of performing the resistance changing operation once under the state in which the current was set to 300 μA. As should be understood from this, if a high current is flowed through the non-volatile memory element 30 even once, the non-uniformity of the resistance values corresponding to the low-resistance state becomes great.

From the above result, it was estimated that it is necessary to perform a writing step using a constant current to attain the non-volatile memory element having a good rewrite characteristic.

However, as can be seen from FIG. 5, the resistance values corresponding to the high-resistance state of the non-volatile memory element 30 are not constant. In the example of FIG. 5, the resistance values corresponding to the high-resistance state are in a range of about 30 to 60 (a.u.), which difference is as about twice. Because of the great non-uniformity of the resistance values corresponding to the high-resistance state, the resistance state of the non-volatile memory element may become the excess-resistance state, in which the resistance value is greater (e.g., resistance value is 100 (a.u.) or greater in the example of FIG. 5) than the resistance value (e.g., resistance value is 60 (a.u.) or smaller in the example of FIG. 5) in a steady operation.

Figure 7:
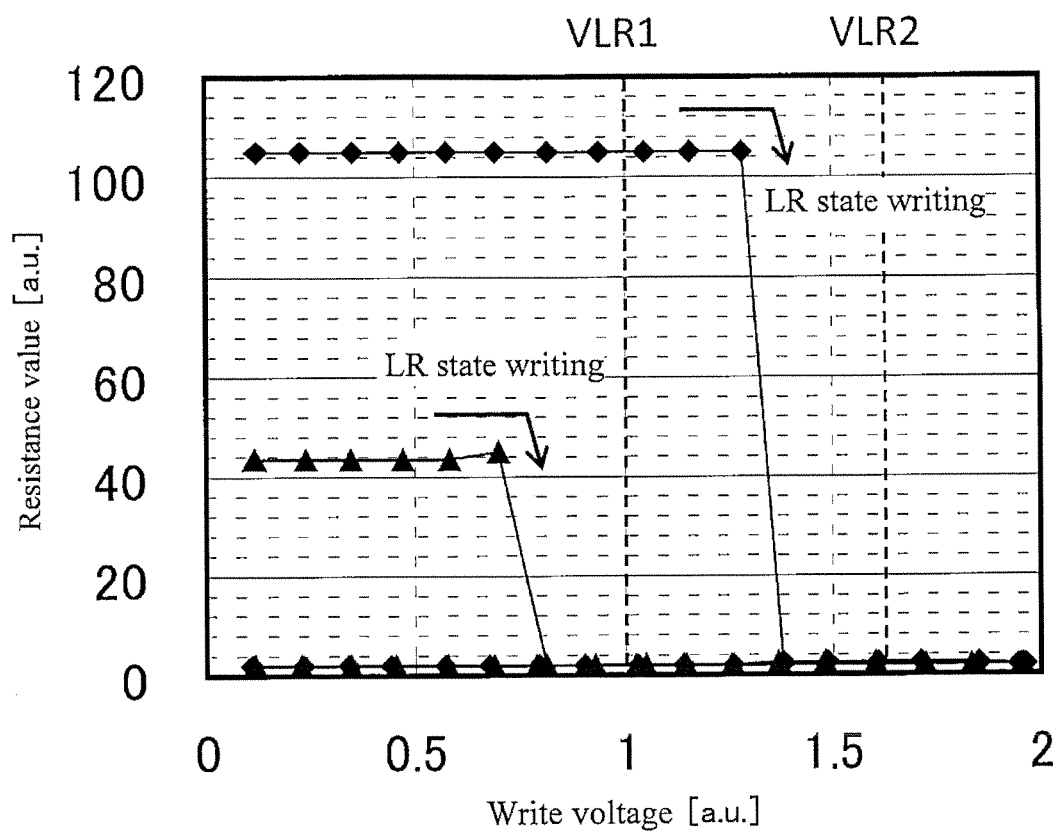
FIG. 7 is a view showing a relationship between the resistance value and a voltage in a writing step, corresponding each of a high-resistance state and an excess-resistance state, in the non-volatile memory element according to the experiment example.

FIG. 7 is a view showing a relationship between the resistance value and the voltage in the writing step, corresponding each of the high-resistance state and the low-resistance state, in the non-volatile memory element according to the experiment example. The resistance value of the non-volatile memory element in the high-resistance state is 45 (a.u.), while the resistance value of the non-volatile memory element in the excess-resistance state is 108 (a.u.).

As can be clearly seen from FIG. 6, in the case of the excess-resistance state in which the resistance value is greater than that corresponding to the high-resistance state, the first write voltage pulse (absolute value of voltage: VLR1) cannot cause the non-volatile memory element to be changed to the low-resistance state, and therefore it is necessary to use the second write voltage pulse (absolute value of voltage: VLR2, VLR2>VLR1) which is greater in voltage than the first write voltage pulse.

Figure 8:
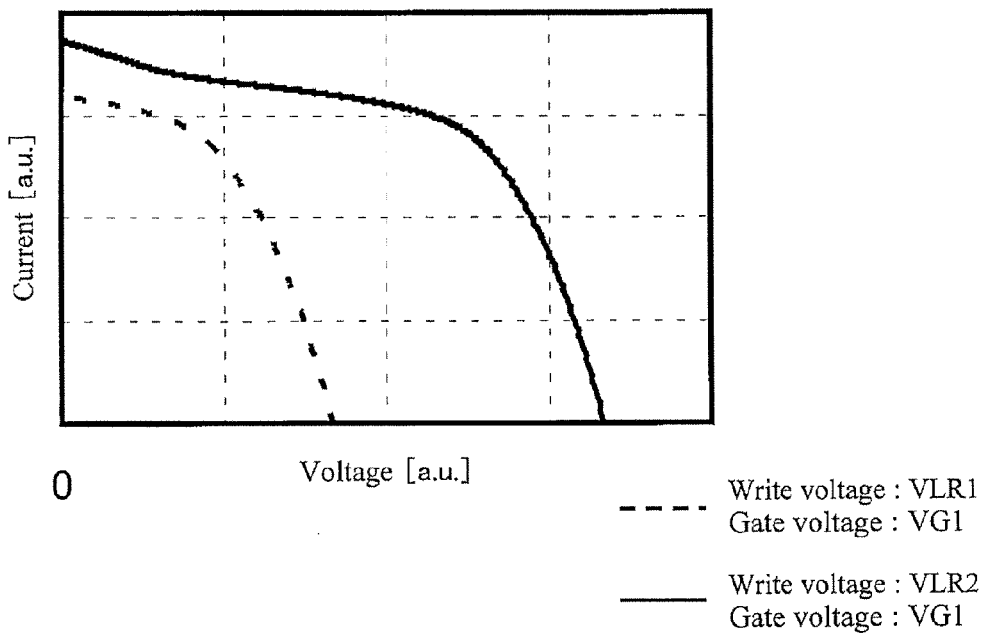
FIG. 8 is a view showing a load curve of a N-type MISFET in a case where a write voltage is changed with a gate voltage being constant, in the non-volatile memory element according to the experiment example.

FIG. 8 is a view showing a load curve of the N-type MISFET in a case where the write voltage is changed with the gate voltage being constant, in the non-volatile memory element according to the experiment example. When the write voltage pulse is increased from VLR1 to VLR2, the load curve of the N-type MISFET 20 changes. In this case, a current which is higher than that in the steady operation flows through the variable resistance element 10. In a case where the variable resistance element 10 in the excess-resistance state in which the resistance value corresponding to the high-resistance state is excessively great is changed to the low-resistance state, a high current is applied to the variable resistance element 10 as described above, which degrades the rewrite characteristic for the above stated reason.

In light of the above, to implement the non-volatile memory element with a good rewrite characteristic, it is necessary to perform the writing step using an equal current even in a case where the high-resistance state becomes the excess-resistance state.

Specifically, the voltage value (absolute value) of the first write voltage pulse VL1 and the voltage value (absolute value) of the voltage applied to the gate terminal in a normal writing step in a case where the non-volatile memory element is in the high-resistance state are set to VLR1 and VG1, respectively.

In contrast, the voltage value (absolute value) of the second write voltage pulse VL2 and the voltage value (absolute value) of the voltage applied to the gate terminal in a writing step in a case where the non-volatile memory element is in the excess-resistance state are set to VLR2 (VLR2>VLR1) and VG2 (VG2<VG1), respectively. This can suppress a current with an excessively great magnitude from flowing through the variable resistance element.

FIG. 9 is a view showing a load curve of the N-type MISFET in a case where the gate voltage is changed according to the write voltage, in the non-volatile memory element according to the experiment example. As shown in FIG. 9, even when the second write voltage pulse (voltage: VLR2) is applied, the amount of the current flowing through the variable resistance element 10 can be made less than that in the example of FIG. 8, because the gate voltage is set to VG2. The value of VG2 can be suitably set according to the gate length (not shown) and channel width (not shown) of the N-type MISFET 20, the value of VG1, the value of VLR1 and the value of VLR2. Specifically, for example, VG2 may be set so that a saturation current in a case where the second write voltage pulse is applied with the gate voltage being set to VG2 becomes closer to a saturation current in a case where the first write voltage pulse VL1 is applied with the gate voltage being set to VG1 than a saturation current in a case where the second write voltage pulse is applied with the gate voltage being set to VG1. Or, for example, VG2 is set so that a saturation current in a case where the second write voltage pulse is applied matches a saturation current in a case where the first write voltage pulse VL1 is applied.

From the above result, it was confirmed that the writing step can be performed using a constant current and a stable rewrite characteristic can be achieved by using the driving method of FIG. 9, even when the high-resistance state becomes the excess-resistance state.

To effectively perform the above described driving method, it may be determined whether or not the non-volatile memory element 30 is in the low-resistance state, after the normal writing step is performed. Specifically, firstly, in the normal writing step, the first write voltage pulse VL1 is applied to the non-volatile memory element 30 and the first gate voltage VG1 is applied to the gate terminal 23 (step S101 of FIG. 4). Then, it is determined whether or not the non-volatile memory element 30 is in the low-resistance state (step S102 of FIG. 4). This determination step may be performed by applying the read voltage pulse to the non-volatile memory element 30 as described above. If it is determined that the non-volatile memory element 30 is not in the low-resistance state, then it may be estimated that the non-volatile memory element 30 was in the excess-resistance state. In this case, by applying the second write voltage pulse VL2 to the non-volatile memory element 30 and applying the second gate voltage VG2 to the gate terminal 23 (step S103 of FIG. 4), the non-volatile memory element 30 can be reliably changed to the low-resistance state.

Modified Example

Although in the above described example, the N-type MISFET is used as the field effect transistor 20, the present embodiment is not limited to this. In the present modified example, the P-type MISFET 20 is used instead of the N-type MISFET 20.

Figure 10:
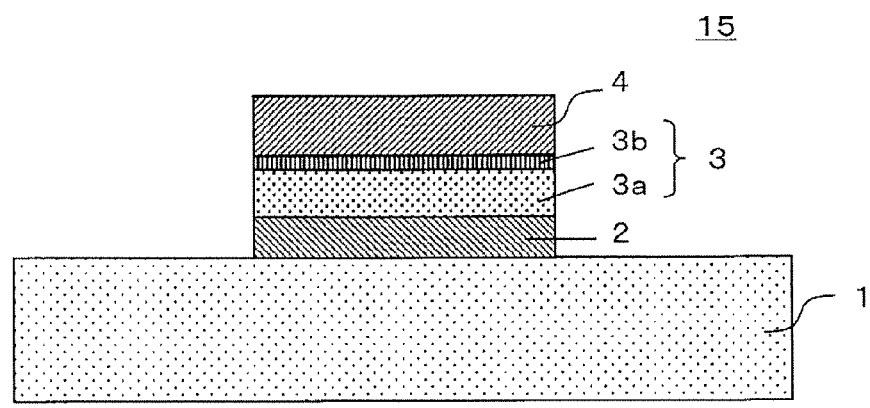
FIG. 10 is a cross-sectional view showing an exemplary schematic configuration of a variable resistance element included in a non-volatile memory element according to a modified example of Embodiment 1.

Although in the variable resistance element 10 of FIG. 1, the first variable resistance layer 3a is placed on the second variable resistance layer 3b, this vertical positional relationship may be reversed. FIG. 10 is a cross-sectional view showing an exemplary schematic configuration of a variable resistance element included in a non-volatile memory element according to the modified example of Embodiment 1.

A variable resistance element 15 included in the non-volatile memory element of the present modified example is different from the variable resistance element 10 in that the positional relationship between the second variable resistance layer 3b and the first variable resistance layer 3a is different. The structure of variable resistance element can be suitably designed by connection with the field effect transistor 20 as will be described later.

Figure 11:
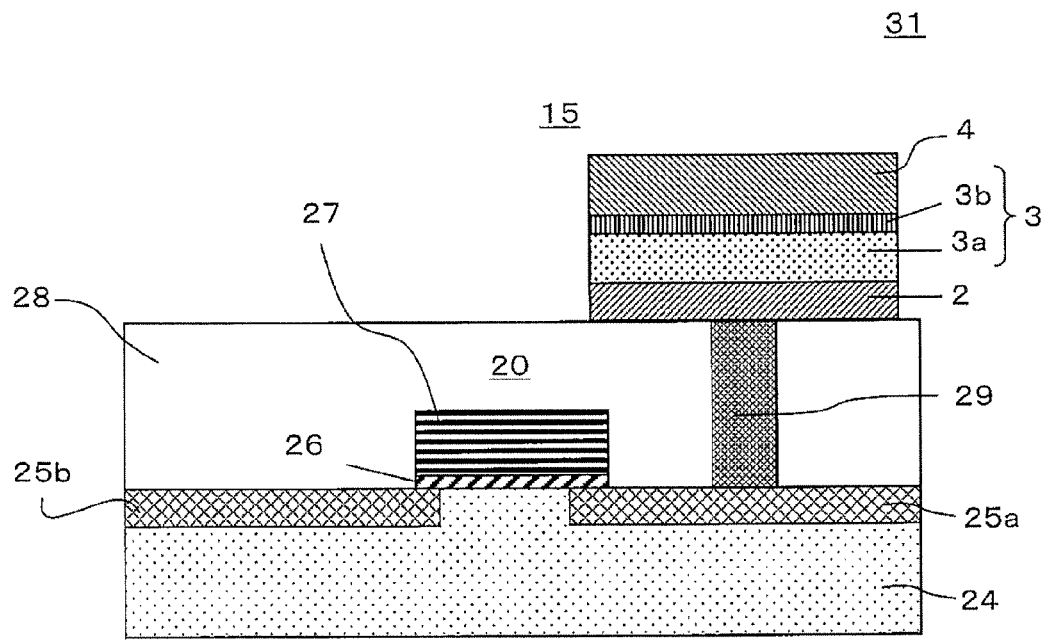
FIG. 11 is a cross-sectional view showing an exemplary schematic configuration of the non-volatile memory element according to the modified example of Embodiment 1.

FIG. 11 is a cross-sectional view showing an exemplary schematic configuration of the non-volatile memory element according to the modified example of Embodiment 1. A non-volatile memory element 31 of the present modified example is different from the non-volatile memory element 30 of FIG. 3 in that the field effect transistor 20 is not the N-type MISFET but is the P-type MISFET, and the vertical positional relationship between the second variable resistance layer 3b and the first variable resistance layer 3a is reversed. Since the configuration of the second variable resistance layer 3b and the configuration of the first variable resistance layer 3a may be the same as those of Embodiment 1, they will not be described in detail repeatedly.

In the present modified example, the second electrode 4 which is in contact with the second variable resistance layer 3b comprising the second metal oxide which is lower in degree of oxygen deficiency may be higher in standard electrode potential than the metal constituting the second metal oxide and the material constituting the first electrode 2. The second metal 4 may comprise, for example, Pt (platinum), Ir (iridium), or palladium (Pd). In general, it is difficult to process such a precious metal. However, by placing the precious metal in the upper portion of the variable resistance element 10 as in the non-volatile memory element 31, it can be processed relatively easily.

The first electrode 2 which is connected to the first variable resistance layer 3a comprising the first metal oxide which is higher in degree of oxygen deficiency may comprise a material which is lower in standard electrode potential than the metal constituting the second metal oxide, such as tungsten (W), nickel (Ni), tantalum (Ta), titanium (Ti), aluminum (Al), tantalum nitride (TaN), or titanium nitride (TiN).

When the standard electrode potential of the first electrode 2 in the non-volatile memory element 31 of FIG. 11 is E1 and the standard electrode potential of the second electrode 4 in the non-volatile memory element 31 is E2, E2>E1 may be satisfied. When such a requirement of the standard electrode potential is satisfied, a resistance changing phenomenon stably occurs in the vicinity of the interface between the second electrode 4 and the second variable resistance layer 3b.

In the present modified example, a good rewrite characteristic of the variable resistance element can be maintained, and therefore a stable storing operation can be achieved.

Embodiment 2

A non-volatile memory device of Embodiment 2 includes a memory cell array using the non-volatile memory elements of Embodiment 1 and its modified example, and is configured to execute the driving method of the non-volatile memory element described in Embodiment 1 and its modified example.

The non-volatile memory device of Embodiment 2 comprises a plurality of non-volatile memory elements which are arranged in matrix and each of which includes a variable resistance element including a first electrode, a second electrode, and a variable resistance layer which is disposed between the first electrode and the second electrode and reversibly changes its resistance state between a low-resistance state and a high-resistance state in which a resistance value is greater than a resistance value corresponding to the low-resistance state, in response to a voltage pulse applied between the first electrode and the second electrode, and a field effect transistor including a first input/output terminal connected to the first electrode, a second input/output terminal, and a gate terminal for controlling electric conduction between the first input/output terminal and the second input/output terminal; a plurality of first wires connected to second electrodes of the plurality of non-volatile memory elements arranged as corresponding to rows or columns of the matrix, respectively; a plurality of second wires connected to second input/output terminals of the plurality of non-volatile memory elements arranged as corresponding to the rows or the columns of the matrix, respectively; a plurality of third wires connected to gate terminals of the plurality of non-volatile memory elements arranged as corresponding to the rows or the columns of the matrix, respectively; a write unit configured to selectively apply between one of the first wires and corresponding one of the second wires, a plurality of voltage pulses including a third voltage pulse having a first polarity, a first voltage pulse having a second polarity which is different from the first polarity, and a second voltage pulse which has the second polarity and has a greater absolute value than the first voltage pulse; and a gate voltage setting unit configured to selectively apply to one of the third wires, a plurality of gate voltage pulses including a first gate voltage, and a second gate voltage which is smaller in absolute value than the first gate voltage, wherein the second polarity is such that the second input/output terminal of the field effect transistor becomes a source terminal, the non-volatile memory device further comprising: a control unit configured to cause the gate voltage setting unit to apply the second gate voltage to the third wire connected to at least one of memory cells which is applied with the second voltage pulse, when the write unit applies the second voltage pulse to at least a portion of the plurality of first wires and of the plurality of second wires.

In such a configuration, it becomes possible to lessen the non-uniformity of the resistance values in the non-volatile memory element.

The above non-volatile memory device may comprise a read circuit configured to read resistance value information of each of the plurality of memory cells, and the control unit may be configured to select at least one of the first voltage pulse and the second voltage pulse and apply the selected voltage pulse to at least a portion of the plurality of first wires and of the plurality of second wires, based on an input signal received from the read circuit.

In the above non-volatile memory device, the gate voltage circuit may include a first gate power supply for generating the first gate voltage and a second gate power supply for generating the second gate voltage.

In the above non-volatile memory device, the field effect transistor may be a N-type FET, the first polarity may be such that an electric potential of the second input/output terminal becomes higher than an electric potential of the second electrode, and the second polarity may be such that the electric potential of the second input/output terminal becomes lower than the electric potential of the second electrode.

In the above non-volatile memory device, the field effect transistor may be a P-type FET, the first polarity may be such that the electric potential of the second input/output terminal becomes lower than the electric potential of the second electrode, and the second polarity may be such that the electric potential of the second input/output terminal becomes higher than the electric potential of the second electrode.

In the above non-volatile memory device, the variable resistance layer may include a first variable resistance layer comprising an oxygen-deficient metal oxide and a second variable resistance layer comprising a metal oxide which is lower in degree of oxygen deficiency than the first variable resistance layer, the field effect transistor may be a N-type FET, the first variable resistance layer may be in contact with the second electrode, and the second variable resistance layer may be in contact with the first electrode.

In such a configuration, it becomes possible to obtain the non-volatile memory element having a good rewrite characteristic, and integrate the non-volatile memory elements with a higher density using the N-type MISFETs.

In the above non-volatile memory device, the variable resistance layer may include a first variable resistance layer comprising an oxygen-deficient metal oxide and a second variable resistance layer comprising a metal oxide which is lower in degree of oxygen deficiency than the first variable resistance layer, the field effect transistor may be a P-type FET, the first variable resistance layer may be in contact with the first electrode, and the second variable resistance layer may be in contact with the second electrode.

In such a configuration, it becomes possible to attain the non-volatile memory element including the variable resistance element which can be easily processed.

In the above non-volatile memory device, the field effect transistor may be a N-type FET, and when the standard electrode potential of the first electrode is E1 and the standard electrode potential of the second electrode is E2, E1>E2 may be satisfied.

In such a configuration, it becomes possible to obtain the non-volatile memory element having a good rewrite characteristic, and integrate the non-volatile memory elements with a higher density using the N-type MISFETs.

In the above non-volatile memory device, the field effect transistor may be a P-type FET, and when the standard electrode potential of the first electrode is E1 and the standard electrode potential of the second electrode is E2, E2>E1 may be satisfied.

In such a configuration, it becomes possible to attain the non-volatile memory element including the variable resistance element which can be easily processed.

In the above non-volatile memory device, the variable resistance layer may include a first variable resistance layer comprising a first metal oxide and a second variable resistance layer comprising a second metal oxide, the first metal oxide and the second metal oxide may be oxides of the same metal, and when a composition of the first metal oxide is expressed as $MO_x$ and a composition of the second metal oxide is expressed as $MO_y$, y>x may be satisfied.

In such a configuration, it becomes possible to attain a stable resistance changing operation of the non-volatile memory element.

In the above non-volatile memory device, each of the first metal oxide and the second metal oxide may be a tantalum oxide.

In such a configuration, it becomes possible to attain a stable resistance changing operation of the non-volatile memory element.

In the above non-volatile memory device, each of the first metal oxide and the second metal oxide may be a hafnium oxide.

In such a configuration, it becomes possible to attain a stable resistance changing operation of the non-volatile memory element.

In the above non-volatile memory device, each of the first metal oxide and the second metal oxide may be a zirconium oxide.

In such a configuration, it becomes possible to attain a stable resistance changing operation of the non-volatile memory element.

In the above non-volatile memory device, the variable resistance layer may include a first variable resistance layer comprising a first metal oxide and a second variable resistance layer comprising a second metal oxide, the first metal oxide and the second metal oxide may be oxides of different metals, and when a standard electrode potential of the metal constituting the first metal oxide is EN and a standard electrode potential of the metal constituting the second metal oxide is EM, EN<EM may be satisfied.

In such a configuration, it becomes possible to attain a more stable resistance changing operation of the non-volatile memory element than in a case where the first metal oxide and the second metal oxide are oxides of the same metal.

In the above non-volatile memory device, the first metal oxide may be a tantalum oxide and the second metal oxide may be an aluminum oxide.

In such a configuration, it becomes possible to attain a stable resistance changing operation of the non-volatile memory element.

In the above non-volatile memory device, the first metal oxide may be a tantalum oxide and the second metal oxide may be a hafnium oxide.

In such a configuration, it becomes possible to attain a stable resistance changing operation of the non-volatile memory element.

In the above non-volatile memory device, the second gate voltage may be selected with a frequency which is equal to or less than 1/10000 of a frequency with which the first gate voltage is selected.

[Device Configuration]

Figure 12:
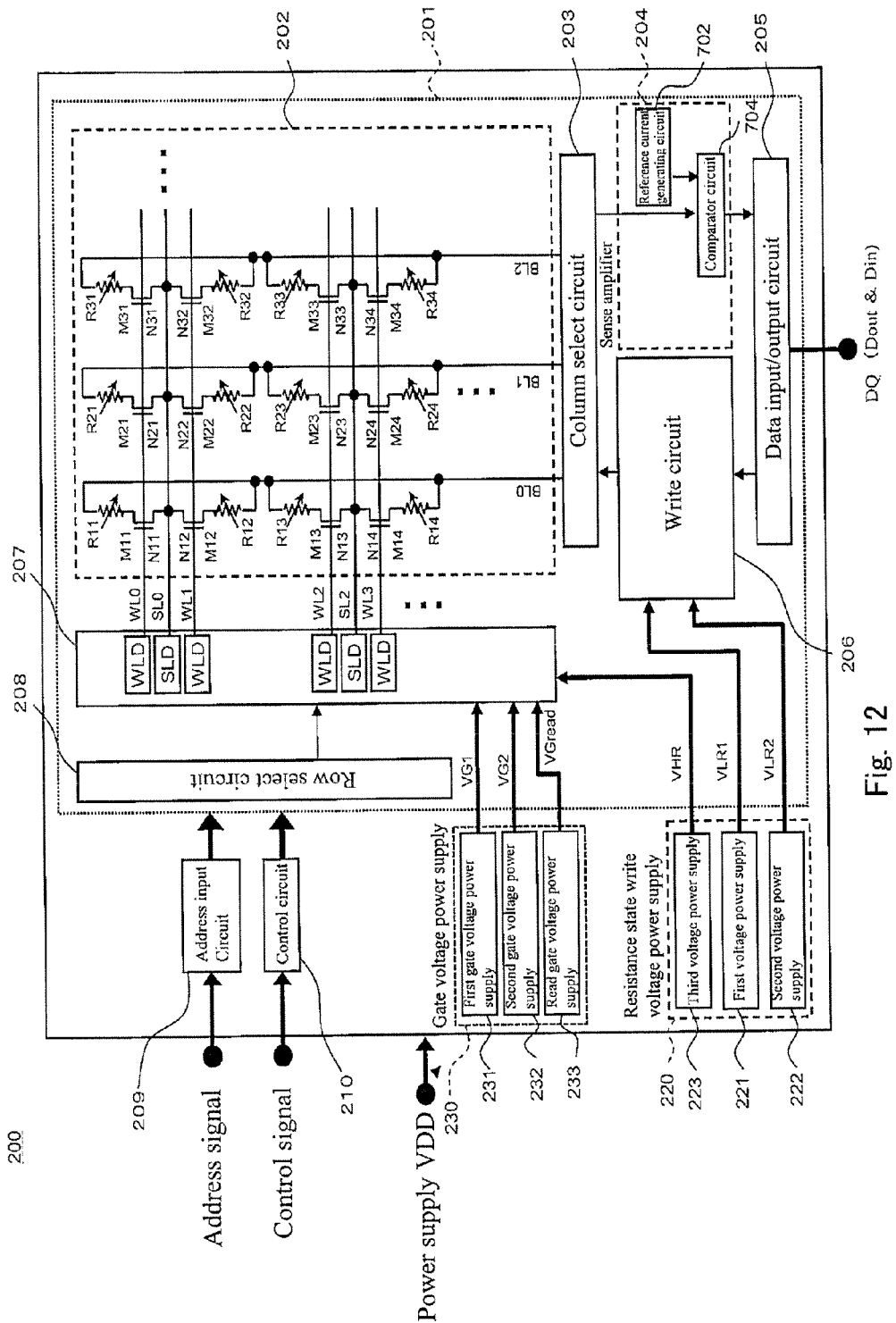
FIG. 12 is a block diagram showing a configuration of a non-volatile memory device according to Embodiment 2.

FIG. 12 is a block diagram showing a configuration of a non-volatile memory device according to Embodiment 2.

As shown in FIG. 12, the non-volatile memory device 200 of Embodiment 2 includes a memory main body section 201 on the semiconductor substrate. The memory main body section 201 includes a memory array 202 including the 1T1R non-volatile memory elements (memory cells) each of which is shown in FIGS. 2A and 3 and which are arranged in matrix, a row select circuit 208, a row driver 207 including word line drivers WLD and source line drivers SLD, a column select circuit 203, a write circuit 206 for writing data, a sense amplifier 204 for detecting an amount of a current flowing through a selected bit line and determining the high-resistance state as data "0" or the low-resistance state as data "1", and a data input/output circuit 205 for performing input/output processing of input/output data via a terminal DQ.

The sense amplifier 204 (read circuit) includes a reference current generating circuit 702 and a comparator circuit 704.

The non-volatile memory device 200 further includes as a resistance state write voltage power supply 220, a first voltage power supply 221 (first gate power supply) for outputting VLR1, a second voltage power supply 222 (second gate power supply) for outputting VLR2, and a third voltage power supply 223 for outputting VHR.

The non-volatile memory device 200 further includes as a gate voltage power supply 230, a first gate voltage power supply 231 for outputting VG1, a second gate voltage power supply 232 for outputting VG2, and a read gate voltage power supply 233 for outputting VGread.

The non-volatile memory device 200 further includes an address input circuit 209 which receives an address signal externally input, and a control circuit 210 for controlling the operation of the memory main body section 201 in accordance with a control signal externally input thereto.

The memory array 202 includes a plurality of word lines WL0, WL1, WL2, WL3, . . . and a plurality of bit lines BL0, BL1, BL2, . . . , which are formed above the semiconductor substrate such that the plurality word lines cross the plurality of bit lines, respectively, a plurality of NMOS transistors N11, N12, N13, N14, . . . , N21, N22, N23, N24, . . . , N31, N32, N33, N34, . . . (hereinafter will be expressed as "transistors N11, N12, . . . ") such that they respectively correspond to cross-points of the plurality of word lines WL0, WL1, WL2, WL3, . . . and the plurality of bit lines BL0, BL1, BL2, . . . , respectively, and a plurality of variable resistance elements R11, R12, R13, R14, . . . , R21, R22, R23, R24, . . . , R31, R32, R33, R34, . . . (hereinafter, will be expressed as variable resistance elements R11, R12, . . . "), which are connected in series with the transistors N11, N12, . . . such that one variable resistance element corresponds to one transistor. The respective constituents constitute memory cells M11, M12, M13, M14, . . . M21, M22, M23, M24, . . . , M31, M32, M33, M34, . . . (hereinafter will be expressed as "memory cells M11, M12, . . . "), respectively.

Each of the memory cells M11, M12, . . . may be configured similarly to that of, for example, the 1T1R non-volatile memory element of Embodiment 1 of FIGS. 2A and 3, and will not be described in detail repeatedly.

As shown in FIG. 12, the gate terminals of the transistors N11, N21, N31, . . . , are connected to the word line WL0, the gate terminals of the transistors N12, N22, N32, . . . , are connected to the word line WL1, the gate terminals of the transistors N13, N23, N33, . . . , are connected to the word line WL2, and the gate terminals of the transistors N14, N24, N34, . . . , are connected to the word line WL3. The word lines WL1, WL2, WL3, . . . correspond to the third wires of Embodiment 1, respectively.

The second input/output terminals of the transistors N11, N21, N31, . . . and of the transistors N12, N22, N32, . . . are connected to a common source line SL0, while the second input/output terminals of the transistors N13, N23, N33, . . . and of the transistors N14, N24, N34, . . . are connected to a common source line SL2. In other words, the source lines SL0, SL2, . . . are placed such that they extend in parallel with the word lines WL0, WL1, WL2, WL3, . . . , and cross the bit lines BL0, BL1, BL2, . . . (in the present embodiment, the source lines SL0, SL2, . . . are perpendicular to the bit lines BL0, BL1, BL2, . . . ). Although in the above described exemplary configuration, the source lines are placed in parallel with the word lines, they may be placed in parallel with the bit lines. Although the source lines are configured as plate lines to apply an equal electric potential to the transistors connected thereto, the non-volatile memory device may include a source line select circuit/driver having a configuration similar to that of the row select circuit/driver, and the source line select circuit/driver may be configured to drive a selected source line and an unselected source line, with different voltages (including different polarities). The source lines SL0, SL2, . . . correspond to the second wires of Embodiment 1, respectively. In the example of FIG. 12, the transistors N11, N21, N31, . . . are the N-type FETs, respectively.

The second electrodes of the variable resistance elements R11, R12, R13, R14, . . . are connected to the bit line BL0, the second electrodes of the variable resistance elements R21, R22, R23, R24, . . . are connected to the bit line BL1, and the second electrodes of the variable resistance elements R31, R32, R33, R34, . . . are connected to the bit line BL2. In this way, in the memory array 202 of the present embodiment, the second electrodes of the variable resistance elements R11, R21, R31, . . . are directly connected to the corresponding bit lines BL0, BL1, BL2, . . . such that the NMOS transistors N11, N21, N31, . . . are not interposed between the second electrodes of the variable resistance elements R11, R21, R31 . . . and the bit lines BL0, BL1, BL2, . . . . The bit lines BL0, BL1, BL2, . . . correspond to the first wires of Embodiment 1, respectively.

During a normal writing operation (change from the high-resistance state to the low-resistance state), input data Din input to the data input/output circuit 205 indicates a writing operation. At this time, the control circuit 210 outputs a signal for causing application of the first voltage pulse to the write circuit 206 and the row driver 207. The first voltage pulse may be, for example, the first write voltage pulse of Embodiment 1.

When the non-volatile memory element is changed from the excess-resistance state to the low-resistance state, the control circuit 210 outputs a signal for causing application of the second voltage pulse to the write circuit 206 and the row driver 207. The second voltage pulse may be, for example, the second write voltage pulse of Embodiment 1.

During an erasing operation (change from the low-resistance state to the high-resistance state), input data Din input to the data input/output circuit 205 indicates an erasing operation. At this time, the control circuit 210 outputs a signal for causing application of the third voltage pulse to the write circuit 206 and the row driver 207. The third voltage pulse may be, for example, the erase voltage pulse of Embodiment 1.

During a reading operation, the control circuit 210 outputs a signal for causing application of the read voltage pulse to the write circuit 206 and the row driver 207. At this time, the sense amplifier 204 causes the comparator circuit 704 to compare the current flowing through the selected bit line and the current received from the reference current generating circuit 702, to determine whether the selected memory cell is in the high-resistance state or in the low-resistance state. The sense amplifier 204 outputs a result of the determination via the data/input circuit 205 and to the control circuit 210. The read voltage pulse may be, for example, the read voltage pulse of Embodiment 1.

The control circuit 210 reads the selected memory cell via the sense amplifier 204, after the first voltage pulse is applied (step S101 of FIG. 4) in the normal writing operation. When the control circuit 210 determines that the selected memory cell is in the high-resistance state (has not been changed to the low-resistance state), it determines that this memory cell is in the excess-resistance state (step S102 of FIG. 4). In this case, as described above, the control circuit 210 applies the second voltage pulse to the selected memory cell (step S103 of FIG. 4).

The row select circuit 208 receives the row address signal output from the address input circuit 209, and applies a predetermined voltage to the selected word line, from the row driver 207 (from the word line driver circuit WLD corresponding to one of the plurality of word lines WL0, WL1, WL2, WL3, . . . ), based on the received row address signal. The predetermined voltage includes the voltage received from the gate voltage power supply 230, and may include the first gate voltage VG1, the second gate voltage VG2 which is smaller in absolute value than the first gate voltage, the read gate voltage VGread, and 0V. The row driver 207 applies to the selected word line one of VG1, VG2, VGread, and 0V based on the signal received from the control circuit 210.

The row select circuit 208 receives the row address signal output from the address input circuit 209, and applies a predetermined voltage to the selected source line, from the row driver 207 (from the source line driver circuit SLD corresponding to one of the plurality of source lines SL0, SL2, . . . ), based on the received row address signal. The predetermined voltage includes the voltage applied from the resistance state write voltage power supply 220, and may include VHR and 0V. The row driver 207 applies one of VHR and 0V to the selected source line based on the signal received from the control circuit 210.

The write circuit 206 applies a predetermined voltage to the selected bit line. The predetermined voltage includes the voltage applied from the resistance state write voltage power supply 220, and may include VLR1, VLR2, Vread and 0V. The write circuit 206 applies one of VLR1, VLR2, Vread, and 0V to the selected bit line based on the signal received from the control circuit 210.

In the example of FIG. 12, the write circuit 206, the resistance state write voltage power supply 220, the row select circuit 208, the row driver 207, and the column select circuit 203 may constitute a write unit.

In the example of FIG. 12, the gate voltage power supply 230, the row select circuit 208, and the row driver 207 may constitute a gate voltage setting unit.

In the example of FIG. 12, the control circuit 210 may constitute a control unit.

[Voltage Application Pattern]

Figure 13A:
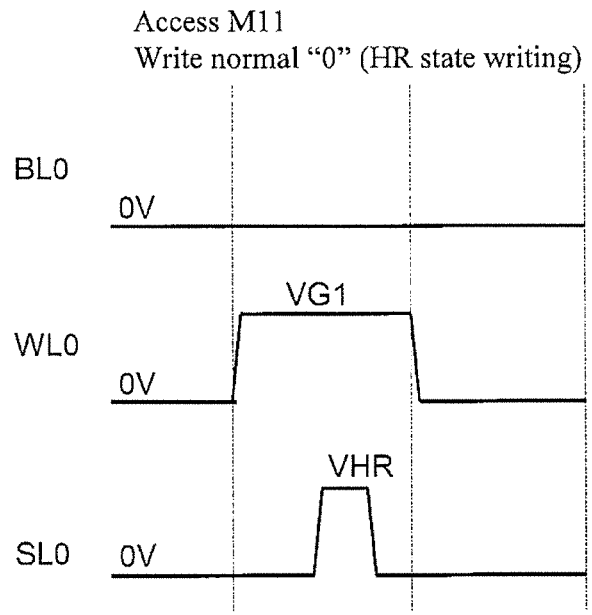
FIG. 13A is a timing chart showing a voltage application pattern in an erasing operation (case where the non-volatile memory element is changed from a low-resistance state to a high-resistance state) of the non-volatile memory device according to Embodiment 2.
Figure 13B:
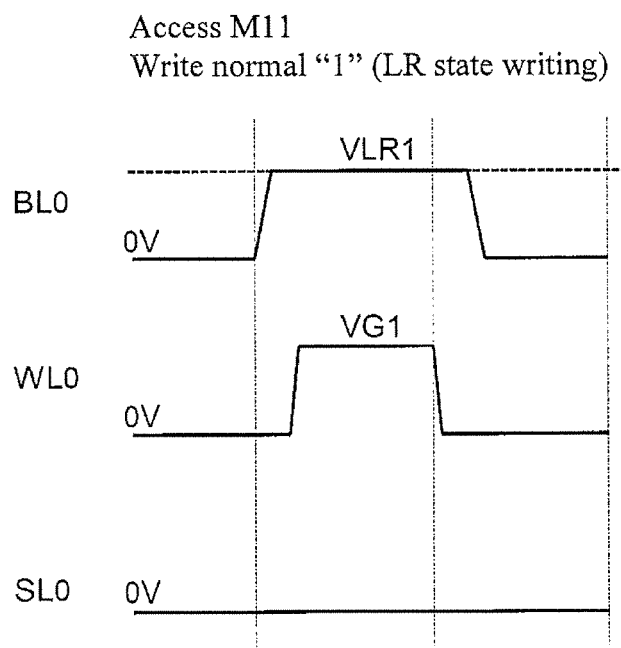
FIG. 13B is a timing chart showing a voltage application pattern in a normal writing operation (case where the non-volatile memory element is changed from the high-resistance state to the low-resistance state) of the non-volatile memory device according to Embodiment 2.
Figure 13C:
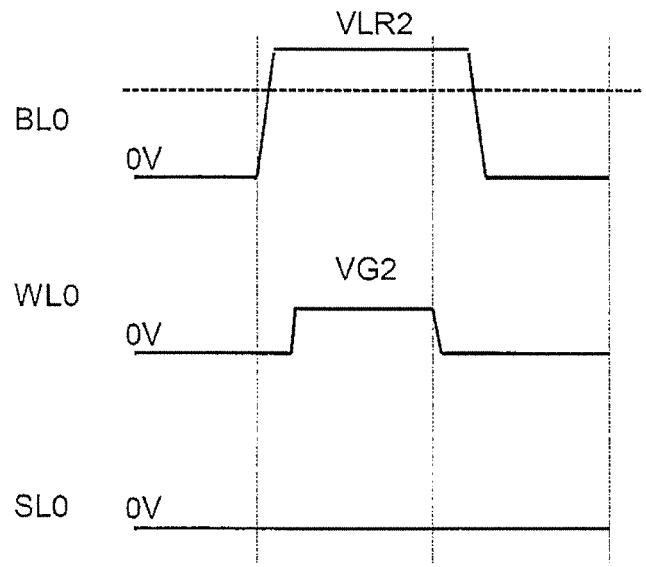
FIG. 13C is a timing chart showing a voltage application pattern in a case where the non-volatile memory element is changed from an excess-resistance state to the low-resistance state of the non-volatile memory device according to Embodiment 2.
Figure 13D:
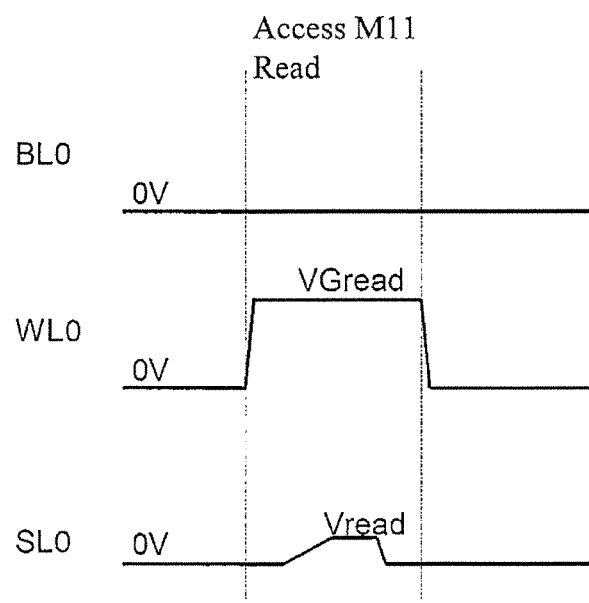
FIG. 13D is a timing chart showing a voltage application pattern in a reading operation of the non-volatile memory device according to Embodiment 2.

FIGS. 13A to 13D are timing charts each showing the voltage application pattern in the non-volatile memory device according to Embodiment 2. FIG. 13A shows the voltage application pattern in the erasing operation (case where the non-volatile memory element is changed from the low-resistance state to the high-resistance state). FIG. 13B shows the voltage application pattern in the normal writing operation (case where the non-volatile memory element is changed from the high-resistance state to the low-resistance state). FIG. 13C shows the voltage application pattern in a case where the non-volatile memory element is changed from the excess-resistance state to the low-resistance state. FIG. 13D shows the voltage application pattern in the reading operation. In the examples of FIGS. 13A to 13D, it is supposed that the selected memory cell is connected to the word line WL0, the bit line BL0, and the source line SL0.

The following operation is performed in such a manner that the control circuit 210 controls the write circuit 206, the resistance state write voltage power supply 220, the row select circuit 208, the row driver 207, the column select circuit 203, and the gate voltage power supply 230.

In the erasing operation (case where the non-volatile memory element is changed from the low-resistance state to the high-resistance state), as shown in FIG. 13A, before the third voltage pulse is applied, 0V is applied to the source line SL0, the word line WL0 and the bit line BL0. Thereafter, the first gate voltage VG1 is applied from WLD to the word line WL0, and thereby the transistor of the selected memory cell is turned ON. Thereafter, at a timing of the pulse application, VHR is applied from the source line driver to the source line SL0. At this time, the voltage pulse (third voltage pulse, erase voltage pulse) with a specified pulse width and a voltage of VHR is applied between the bit line BL0 and the source line SL0, on the basis of the bit line BL0, and thereby the selected memory cell is changed from the low-resistance state to the high-resistance state. The electric potential of the bit line BL0 (first wire, second electrode) is lower than the electric potential of the source line SL0 (second wire, second input/output terminal), which becomes the first polarity. In this case, the transistor N11 is the N-type FET, and the second input/output terminal connected to the source line SL0 is at a higher electric potential side, i.e., drain terminal.

In the normal writing operation (case where the non-volatile memory element is changed from the high-resistance state to the low-resistance state), as shown in FIG. 13B, before the first voltage pulse is applied, 0V is applied to the source line SL0, the word line WL0 and the bit line BL0. Thereafter, the first gate voltage VG1 is applied from WLD to the word line WL0, and thereby the transistor of the selected memory cell is turned ON. Thereafter, at a timing of the pulse application, VLR1 is applied from the write circuit 206 to the bit line BL0. At this time, the voltage pulse (first voltage pulse, first write voltage pulse) with a specified pulse width and a voltage of VLR1 is applied between the source line SL0 and the bit line BL0, on the basis of the source line SL0, and thereby the selected memory cell is changed from the high-resistance state to the low-resistance state. The electric potential of the bit line BL0 (first wire, second electrode) is higher than the electric potential of the source line SL0 (second wire, second input/output terminal), which becomes the second polarity. In this case, the transistor N11 is the N-type FET, and the second input/output terminal connected to the source line SL0 is at a lower electric potential side, i.e., source terminal.

In a case where the non-volatile memory element is changed from the excess-resistance state to the low-resistance state, as shown in FIG. 13C, before the second voltage pulse is applied, 0V is applied to the source line SL0, the word line WL0 and the bit line BL0. Thereafter, the second gate voltage VG2 is applied from WLD to the word line WL0. Thereby the transistor of the selected memory cell is turned ON and a specified current compliance is set. Thereafter, at a timing of the pulse application, VLR2 is applied from the write circuit 206 to the bit line BL0. At this time, the voltage pulse (second voltage pulse, second write voltage pulse) with a specified pulse width and a voltage of VLR2 is applied between the source line SL0 and the bit line BL0, on the basis of the source line SL0, and thereby the selected memory cell is changed from the excess-resistance state to the low-resistance state. The electric potential of the bit line BL0 (first wire, second electrode) is higher than the electric potential of the source line SL0 (second wire, second input/output terminal), which becomes the second polarity. In this case, the transistor N11 is the N-type FET, and the second input/output terminal connected to the source line SL0 is at a lower electric potential side, i.e., source terminal.

In a case where data is read from the selected memory cell, as shown in FIG. 13D, before the read voltage pulse is applied, 0V is applied to the source line SL0, the word line WL0 and the bit line BL0. Thereafter, VGread is applied from WLD to the word line WL0, and thereby the transistor of the selected memory cell is turned ON. Thereafter, at a timing of the pulse application, Vread is applied from the source line driver to the source line SL0. At this time, the voltage Vread is applied between the source line SL0 and the bit line BL0. As a result, a current with an amount corresponding to the resistance state of the selected memory cell flows between the source line SL0 and the bit line BL0.

The configuration (FIGS. 1 to 3, 10, 11) of the non-volatile memory element, operation method (FIG. 4), and the like, described in Embodiment 1, are applicable to the non-volatile memory device of Embodiment 2. Therefore, the specific configuration of them will not be described repeatedly.

Although the transistor is the N-type FET in the above described example, a similar operation can take place, for example, by reversing the polarity of the voltage to be applied in a state in which the variable resistance element is connected the P-type FET such that the vertical positional relationship of the constituents of the element is reversed, in the case where the transistor is the P-type FET.

Numeral improvements and alternative embodiments of the present disclosure will be conceived by those skilled in the art in view of the foregoing description. Accordingly, the description is to be construed as illustrative only, and is provided for the purpose of teaching those skilled in the art the best mode of carrying out the present disclosure. The details of the structure and/or function may be varied substantially without departing from the spirit of the present disclosure.

INDUSTRIAL APPLICABILITY

An aspect of the present disclosure is useful as a driving method of a non-volatile memory element, which can lessen non-uniformity of resistance values in the non-volatile memory element.

REFERENCE SIGNS LIST 1 substrate
1 first electrode
3 variable resistance layer
3a first variable resistance layer
3b second variable resistance layer
4 second electrode
10 variable resistance element
11 first terminal
12 second terminal
15 variable resistance element
20 field effect transistor
21 first input/output terminal
22 second input/output terminal
23 gate terminal
24 semiconductor substrate
25a first diffusion layer
25b second diffusion layer
26 gate insulating layer
27 gate electrode
28 interlayer insulating layer
29 conductive via
30 non-volatile memory element
31 non-volatile memory element

The invention claimed is:
1. A method of driving a non-volatile memory element including:
   a variable resistance element including a first electrode, a second electrode, and a variable resistance layer which is disposed between the first electrode and the second electrode and reversibly changes its resistance state between a low-resistance state and a high-resistance state in which a resistance value is greater than a resistance value corresponding to the low-resistance state, in response to a voltage pulse applied between the first electrode and the second electrode; and
   a field effect transistor including a first input/output terminal connected to the first electrode, a second input/output terminal, and a gate terminal for controlling electric conduction between the first input/output terminal and the second input/output terminal, the method comprising:
   applying an erase voltage pulse with a first polarity between the second electrode and the second input/output terminal, to change the variable resistance layer from the low-resistance state to the high-resistance state;
   applying a write voltage pulse with a second polarity which is different from the first polarity, between the second electrode and the second input/output terminal, to change the variable resistance layer from the high-resistance state to the low-resistance state;

wherein the second polarity is such that the second input/output terminal of the field effect transistor becomes a source terminal;

applying a first gate voltage to the gate terminal of the field effect transistor, when a first write voltage pulse is applied between the second electrode and the second input/output terminal, to change the variable resistance layer in the high-resistance state to the low-resistance state; and applying a second gate voltage which is smaller in absolute value than the first gate voltage, to the gate terminal of the field effect transistor, when a second write voltage pulse which is greater in absolute value of voltage than the first write voltage pulse is applied between the second electrode and the second input/output terminal, to change the variable resistance layer in an excess-resistance state to the low-resistance state.

2. The method of driving the non-volatile memory element according to claim 1,
wherein the field effect transistor is a N-type FET;
wherein the first polarity is such that an electric potential of the second input/output terminal becomes higher than an electric potential of the second electrode; and
wherein the second polarity is such that the electric potential of the second input/output terminal becomes lower than the electric potential of the second electrode.

3. The method of driving the non-volatile memory element according to claim 1,
wherein the field effect transistor is a P-type FET;
wherein the first polarity is such that an electric potential of the second input/output terminal becomes lower than an electric potential of the second electrode; and
wherein the second polarity is such that the electric potential of the second input/output terminal becomes higher than the electric potential of the second electrode.

4. The method of driving the non-volatile memory element according to claim 1,
wherein the variable resistance layer includes:
a first variable resistance layer comprising an oxygen-deficient metal oxide; and
a second variable resistance layer comprising a metal oxide which is lower in degree of oxygen deficiency than the first variable resistance layer;
wherein the field effect transistor is a N-type FET; and
wherein the first variable resistance layer is in contact with the second electrode, and the second variable resistance layer is in contact with the first electrode.

5. The method of driving the non-volatile memory element according to claim 1,
wherein the variable resistance layer includes:
a first variable resistance layer comprising an oxygen-deficient metal oxide; and
a second variable resistance layer comprising a metal oxide which is lower in degree of oxygen deficiency than the first variable resistance layer;
wherein the field effect transistor is a P-type FET; and
wherein the first variable resistance layer is in contact with the first electrode, and the second variable resistance layer is in contact with the second electrode.

6. The method of driving the non-volatile memory element according to claim 1,
wherein the field effect transistor is a N-type FET; and
wherein when a standard electrode potential of the first electrode is E1 and a standard electrode potential of the second electrode is E2, E1>E2 is satisfied.

7. The method of driving the non-volatile memory element according to claim 1, wherein the variable resistance layer includes:
a first variable resistance layer comprising a first metal oxide; and
a second variable resistance layer comprising a second metal oxide;
wherein the first metal oxide and the second metal oxide are oxides of the same metal; and
wherein when a composition of the first metal oxide is expressed as $MO_x$, and a composition of the second metal oxide is expressed as $MO_y$, y>x is satisfied.

8. The method of driving the non-volatile memory element according to claim 7,
wherein each of the first metal oxide and the second metal oxide is a tantalum oxide.

9. The method of driving the non-volatile memory element according to claim 1,
wherein the variable resistance layer includes:
a first variable resistance layer comprising a first metal oxide; and
a second variable resistance layer comprising a second metal oxide;
wherein the first metal oxide and the second metal oxide are oxides of different metals; and
wherein when a standard electrode potential of the metal constituting the first metal oxide is EN and a standard electrode potential of the metal constituting the second metal oxide is EM, EN<EM is satisfied.

10. The method of driving the non-volatile memory element according to claim 1, comprising the steps of:
(A) applying the first gate voltage to the gate terminal and applying the first write voltage pulse between the second electrode and the second input/output terminal, to change the variable resistance layer to the low-resistance state; and
(B) when the variable resistance layer is not changed to the low-resistance state after the step (A),
determining that the variable resistance layer is in an excess-resistance state, applying the second gate voltage to the gate terminal, and applying the second write voltage pulse between the second electrode and the second input/output terminal.

11. A non-volatile memory device comprising:
a plurality of non-volatile memory elements which are arranged in matrix and each of which includes a variable resistance element including a first electrode, a second electrode, and a variable resistance layer which is disposed between the first electrode and the second electrode and reversibly changes its resistance state between a low-resistance state and a high-resistance state in which a resistance value is greater than a resistance value corresponding to the low-resistance state, in response to a voltage pulse applied between the first electrode and the second electrode, and a field effect transistor including a first input/output terminal connected to the first electrode, a second input/output terminal, and a gate terminal for controlling electric conduction between the first input/output terminal and the second input/output terminal;
a plurality of first wires connected to second electrodes of the plurality of non-volatile memory elements arranged as corresponding to rows or columns of the matrix, respectively;
a plurality of second wires connected to second input/output terminals of the plurality of non-volatile memory elements arranged as corresponding to the rows or the columns of the matrix, respectively;

a plurality of third wires connected to gate terminals of the plurality of non-volatile memory elements arranged as corresponding to the rows or the columns of the matrix, respectively;

a write unit configured to selectively apply between one of the first wires and corresponding one of the second wires, a plurality of voltage pulses including a third voltage pulse having a first polarity, a first voltage pulse having a second polarity which is different from the first polarity, and a second voltage pulse which has the second polarity and has a greater absolute value than the first voltage pulse; and a gate voltage setting unit configured to selectively apply to one of the third wires, a plurality of gate voltage pulses including a first gate voltage, and a second gate voltage which is smaller in absolute value than the first gate voltage;

wherein the second polarity is such that the second input/output terminal of the field effect transistor becomes a source terminal; the non-volatile memory device further comprising:

a control unit configured to cause the gate voltage setting unit to apply the second gate voltage to the third wire connected to at least one of the non-volatile memory elements which is applied with the second voltage pulse, when the write unit applies the second voltage pulse to at least a portion of the plurality of first wires and of the plurality of second wires.

12. The non-volatile memory device according to claim 11, comprising:

a read circuit configured to read resistance value information of each of the plurality of non-volatile memory elements;

wherein the control unit is configured to select at least one of the first voltage pulse and the second voltage pulse and apply the selected voltage pulse to at least a portion of the plurality of first wires and of the plurality of second wires, based on an input signal received from the read circuit.

13. The non-volatile memory device according to claim 11, wherein the gate voltage setting unit includes:

a first gate power supply for generating the first gate voltage; and a second gate power supply for generating the second gate voltage.

14. The non-volatile memory device according to claim 11, wherein the field effect transistor is a N-type FET;

wherein the first polarity is such that an electric potential of the second input/output terminal becomes higher than an electric potential of the second electrode; and wherein the second polarity is such that the electric potential of the second input/output terminal becomes lower than the electric potential of the second electrode.

15. The non-volatile memory device according to claim 11, wherein the field effect transistor is a P-type FET;

wherein the first polarity is such that an electric potential of the second input/output terminal becomes lower than an electric potential of the second electrode; and wherein the second polarity is such that the electric potential of the second input/output terminal becomes higher than the electric potential of the second electrode.

16. The non-volatile memory device according to claim 11, wherein the variable resistance layer includes:

a first variable resistance layer comprising an oxygen-deficient metal oxide; and a second variable resistance layer comprising a metal oxide which is lower in degree of oxygen deficiency than the first variable resistance layer;

wherein the field effect transistor is a N-type FET; and wherein the first variable resistance layer is in contact with the second electrode, and the second variable resistance layer is in contact with the first electrode.

17. The non-volatile memory device according to claim 11, wherein the variable resistance layer includes:

a first variable resistance layer comprising an oxygen-deficient metal oxide; and a second variable resistance layer comprising a metal oxide which is lower in degree of oxygen deficiency than the first variable resistance layer;

wherein the field effect transistor is a P-type FET; and wherein the first variable resistance layer is in contact with the first electrode, and the second variable resistance layer is in contact with the second electrode.

18. The non-volatile memory device according to claim 11, wherein the field effect transistor is a N-type FET; and wherein when a standard electrode potential of the first electrode is E1 and a standard electrode potential of the second electrode is E2, E1>E2 is satisfied.

19. The non-volatile memory device according to claim 11, wherein the variable resistance layer includes:

a first variable resistance layer comprising a first metal oxide; and a second variable resistance layer comprising a second metal oxide;

wherein the first metal oxide and the second metal oxide are oxides of the same metal; and wherein when a composition of the first metal oxide is expressed as $MO_x$ and a composition of the second metal oxide is expressed as $MO_y$, y>x is satisfied.

20. The non-volatile memory device according to claim 19, wherein each of the first metal oxide and the second metal oxide is a tantalum oxide.

21. The non-volatile memory device according to claim 11, wherein the variable resistance layer includes:

a first variable resistance layer comprising a first metal oxide; and a second variable resistance layer comprising a second metal oxide;

wherein the first metal oxide and the second metal oxide are oxides of different metals; and wherein when a standard electrode potential of the metal constituting the first metal oxide is EN, and a standard electrode potential of the metal constituting the second metal oxide is EM, EN<EM is satisfied.

* * * * *